US008503213B2

(12) United States Patent
Chen et al.

(10) Patent No.: US 8,503,213 B2
(45) Date of Patent: Aug. 6, 2013

(54) MEMORY ARCHITECTURE OF 3D ARRAY WITH ALTERNATING MEMORY STRING ORIENTATION AND STRING SELECT STRUCTURES

(75) Inventors: Shih-Hung Chen, Hsinchu (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 306 days.

(21) Appl. No.: 13/078,311

(22) Filed: Apr. 1, 2011

(65) Prior Publication Data
US 2012/0182806 A1 Jul. 19, 2012

Related U.S. Application Data

(60) Provisional application No. 61/434,173, filed on Jan. 19, 2011.

(51) Int. Cl.
G11C 5/06 (2006.01)
(52) U.S. Cl.
USPC .................. 365/63; 365/148; 365/185.17
(58) Field of Classification Search
USPC .............. 365/63, 148, 185.17, 230.06, 96, 365/174
See application file for complete search history.

(56) References Cited

U.S. PATENT DOCUMENTS

| 6,034,882 | A | 3/2000 | Johnson et al. |
| 6,906,940 | B1 | 6/2005 | Lue |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,459,715 | B2 * | 12/2008 | Toda et al. ................. 257/2 |
| 7,995,371 | B2 * | 8/2011 | Rinerson et al. .......... 365/148 |
| 2005/0280061 | A1 | 12/2005 | Lee |
| 2007/0134855 | A1 * | 6/2007 | Lai et al. ................. 438/142 |
| 2008/0101109 | A1 | 5/2008 | Haring-Bolivar et al. |
| 2009/0097321 | A1 | 4/2009 | Kim et al. |
| 2009/0184360 | A1 | 7/2009 | Jin et al. |

(Continued)

FOREIGN PATENT DOCUMENTS
EP 1936681 A1 6/2008
EP 2048709 A2 4/2009

OTHER PUBLICATIONS

Jiyoung Kim et al., "Novel 3-D Structure for Ultra High Density Flash Memory with VRAT (Vertical-Recess-Array-Transistor) and PIPE (Planarized Integration on the same PlanE)," 2008 Symposium on VLSI Technology Digest of Technical Papers, pp. 122-123.

(Continued)

Primary Examiner — Douglas King
(74) Attorney, Agent, or Firm — Kenta Suzue; Haynes Beffel & Wolfeld LLP

(57) ABSTRACT

A 3D memory device includes a plurality of ridge-shaped stacks, in the form of multiple strips of conductive material separated by insulating material, arranged as bit lines which can be coupled through decoding circuits to sense amplifiers. Diodes are connected to the bit lines at either the string select of common source select ends of the strings. The strips of conductive material have side surfaces on the sides of the ridge-shaped stacks. A plurality of word lines, which can be coupled to row decoders, extends orthogonally over the plurality of ridge-shaped stacks. Memory elements lie in a multi-layer array of interface regions at cross-points between side surfaces of the semiconductor strips on the stacks and the word lines.

26 Claims, 30 Drawing Sheets

U.S. PATENT DOCUMENTS

| | | | | |
|---|---|---|---|---|
| 2009/0230449 | A1* | 9/2009 | Sakaguchi et al. | 257/298 |
| 2009/0278193 | A1* | 11/2009 | Murata et al. | 257/324 |
| 2010/0226195 | A1* | 9/2010 | Lue | 365/230.06 |
| 2010/0270593 | A1 | 10/2010 | Lung et al. | |
| 2010/0315875 | A1* | 12/2010 | Kim et al. | 365/185.17 |
| 2010/0322000 | A1* | 12/2010 | Shim et al. | 365/185.03 |
| 2011/0216604 | A1* | 9/2011 | Mikajiri et al. | 365/185.26 |

OTHER PUBLICATIONS

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Soon-Moon Jung et al., "Three Dimensionally Stacked NAND Flash Memory Technology Using Stacking Single Crystal Si Layers on ILD and TANOS Structure for Beyond 30nm Node," Electron Devices Meeting 2006. IEDM '06. International Date: Dec. 11-13, 2006, pp. 1-4.

H. Tanaka et al., "Bit Cost Scalable Technology with Punch and Plug Process for Ultra High Density Flash Memory," Jun. 2007 Symposium on VLSI Technology Digest of Technical Papers, pp. 14-15.

Erh-Kun Lai et al., "A Multi-Layer Stackable Thin-Film Transistor (TFT) NAND-Type Flash Memory," IEDM Aug. 2006, consisting of 4 pages.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Jang et al., "Vertical Cell Array Using TCAP (Terabit Cell Array Transistor) Technology for Ultra High Density NAND Flash Memory," 2009 Symposium on VLSI Technology Digest of Technical Papers, pp. 192-193.

Kim et al., "Multi-Layered Vertical Gate NAND Flash Overcoming Stacking Limit for Terabit Density Storage," 2009 Symposium on VLSI Technology Digest of Technical Papers, pp. 188-189.

Lue et al., "A Novel Buried-Channel FinFET Be-SONOS NAND Flash With Improved Memory Window and Cycling Endurance," 2009 Symposium on VLSI Technology Digest of Technical Papers, pp. 224-225.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, pp. 27.6.1-27.6.4.

Hsu et al., "Study of Sub-30nm Thin Film Transistor (TFT) Charge-Trapping (CT) Devices for 3D NAND Flash Application," 2009 IEEE, pp. 27.4.1-27.4.4.

Paul et al., "Impact of a Process Variation on Nanowire and Nanotube Device Performance," 2007 IEEE, pp. 2369-2376.

Choi et al., "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Jung et al., "Three Dimensionally Stacked NAND Flash Memory Technology Using Stacking Single Crystal Si Layers on ILD and TANOS Structure for Beyong 30nm Node," IEEE IDEM Dec. 11-13, 2006, 4 pages.

Lai et al., "Highly Reliable MA BE-SONOS (Metal-Al2 O3 Bandgap Engineered SONOS) Using a SiO2 Buffer Layer," VLSI Technology, Systems and Applications, 2008 VLSI-TSA 2008 International Symposium on Apr. 21-23, 2008, pp. 58-59.

U.S. Appl. No. 12/430,290, filed Apr. 27, 2009 entitled Integrated Circuit 3D Memory Array and Manufacturing Method by inventors Hsiang-Lan Lung and Hang-Ting Lue, consisting of 44 pages.

* cited by examiner

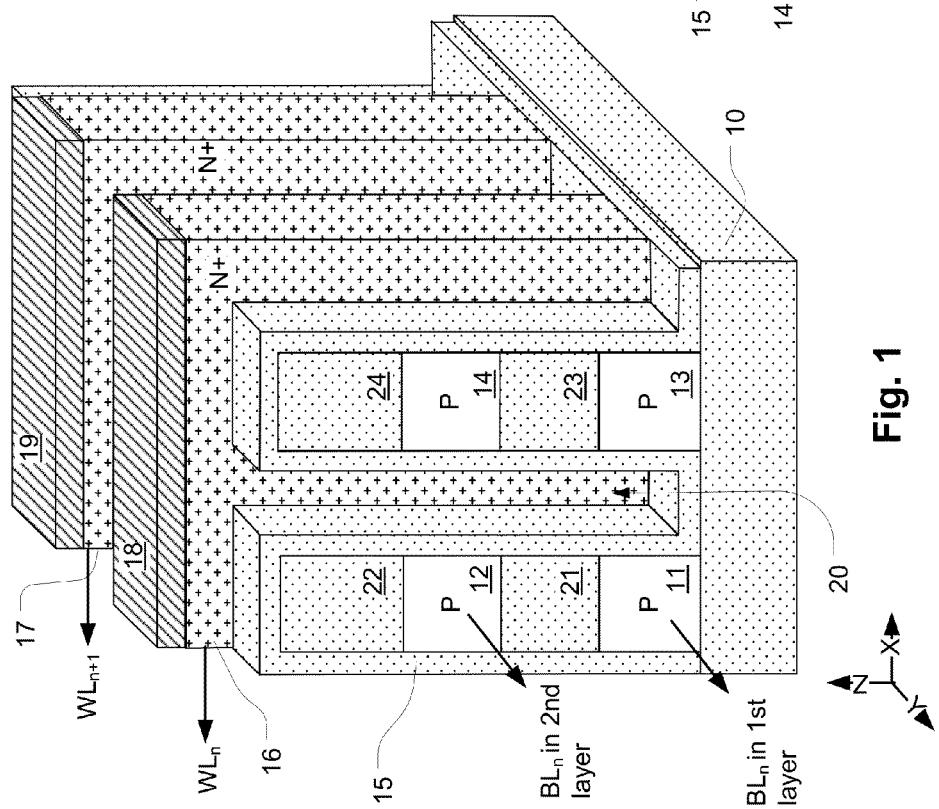
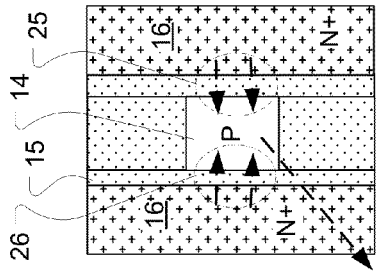
Fig. 2
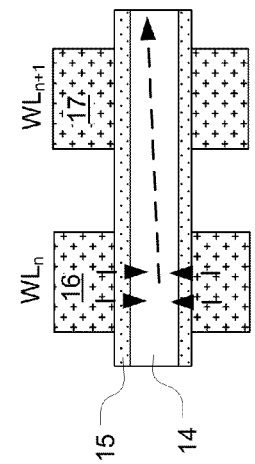
Fig. 3
Fig. 1

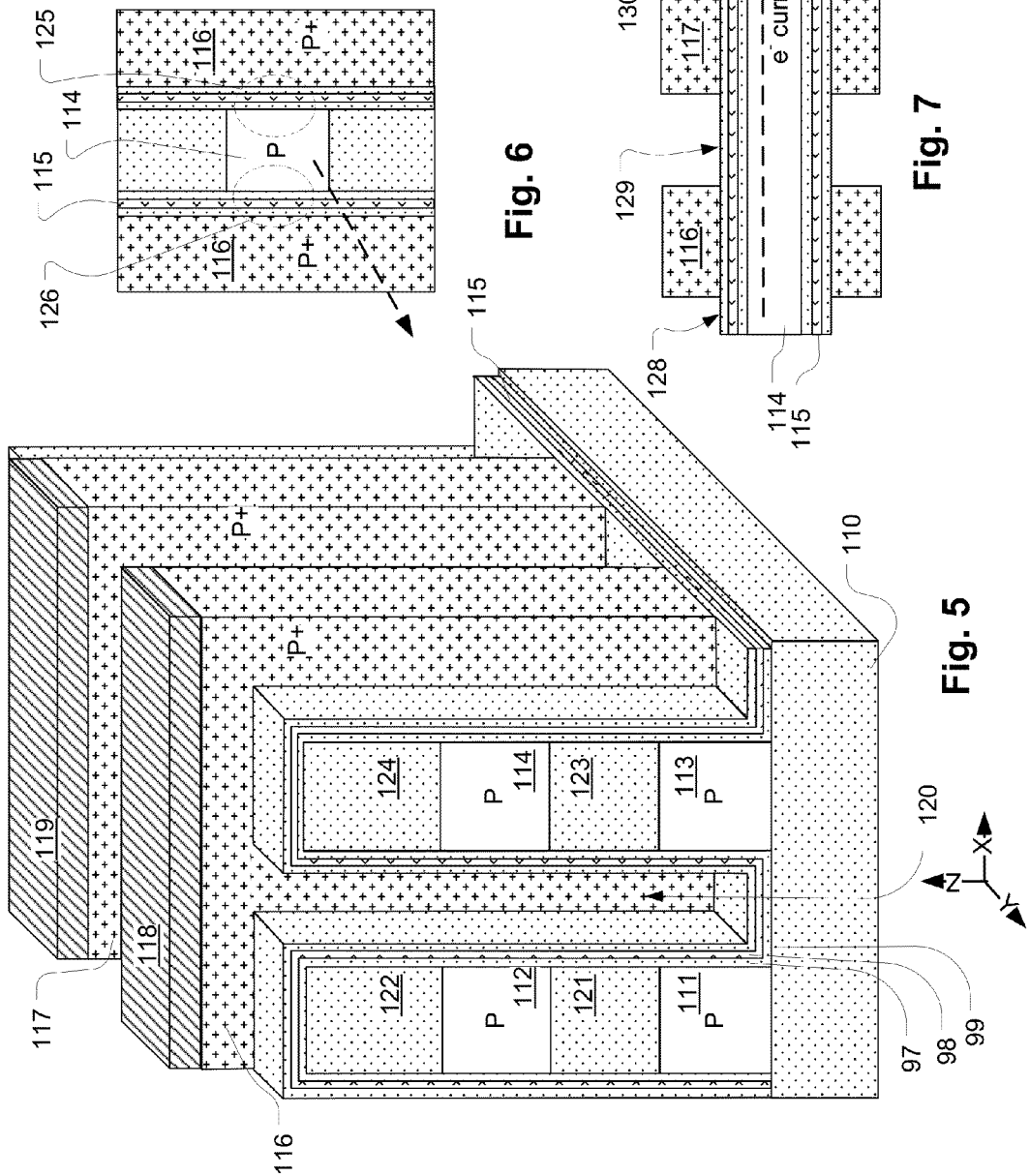

NOP (Number of Programming)

MEMORY ARCHITECTURE OF 3D ARRAY WITH ALTERNATING MEMORY STRING ORIENTATION AND STRING SELECT STRUCTURES

REFERENCE TO RELATED APPLICATIONS

This application claims the benefit of U.S. Provisional Application No. 61/434,173, filed on 19 Jan. 2011, incorporated herein by reference.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used and so on.

It is desirable to provide a structure for three-dimensional integrated circuit memory with a low manufacturing cost, including reliable, very small memory elements and improved process window associated with neighboring stacks of memory cell strings having gate structures.

SUMMARY OF THE INVENTION

In various embodiments, the gate structures of a 3D memory device are arranged to double the pitch. Each stack of memory cell strings has a gate structure that controls electrical connection between a stack of memory cell strings on one side of the gate structure, and a bit line structure on the other side of the gate structure. A particular stack of memory cell strings is selected by selectively biasing its particular gate structure to electrically connect both sides; the other gate structures of other stacks of memory cell strings are biased differently to electrically disconnect both sides.

A limitation on the pitch is the adjacent positioning of gate structures of adjacent stacks of memory cells strings. In some embodiments, the gate structure is positioned on alternating ends of the stacks of memory cells strings. Because the gate structures of adjacent stacks of memory cells strings are no longer positioned adjacently, the pitch is improved. In some embodiments, the orientation of neighboring memory cell strings alternates between bit line end-to-source line end orientation, and source line end-to-bit line end orientation. The source line ends of stacks of memory strings having one orientation, terminate before reaching a bit line structure, and this termination leaves gaps which improve the pitch of the gate structures of memory strings having another orientation.

The 3D memory device includes a plurality of ridge-shaped stacks, in the form of multiple strips of semiconductor material separated by insulating material, arranged in the examples described herein as memory cell strings which can be coupled through decoding circuits to sense amplifiers.

The strips of semiconductor material have side surfaces on the sides of the ridge-shaped stacks. A plurality of word lines, which can be coupled to row decoders, extends orthogonally over the plurality of ridge-shaped stacks. The word lines have surfaces (e.g. bottom surfaces) that conform to the surface of the stacks. This conformal configuration results in a multi-layer array of interface regions at cross-points between side surfaces of the semiconductor strips on the stacks and the word lines. Memory elements lie in the interface regions between the side surfaces of the strips and the word lines. The memory elements are programmable, like the programmable resistance structures or charge trapping structures in the embodiments described below. The combination of the conformal word line, the memory element and the semiconductor strips within a stack at particular interface regions forms a stack of memory cells. As a result of the array structure, a 3D array of memory cells is provided.

The memory elements are arranged in strings between corresponding bit lines and source lines, with each string arranged along a semiconductor material strip.

A plurality of ground select lines also extends orthogonally over the plurality of ridge-shaped stacks. A ground select is at each end of the plurality of ridge-shaped stacks. Ground select devices are established at cross-points between surfaces of the plurality of stacks and the ground select lines.

The gate structures are controlled by string select lines. The string select lines are in two metal layers. The string select lines in a first metal layer are parallel to the plurality of word lines and lead to the string select line decoder. The string select lines in a second metal layer connect the string select lines in the first metal layer to different gate structures. Because the gate structures select particular stacks of semiconductor strips, the string select lines select particular stacks of semiconductor strips.

The plurality of ridge-shaped stacks and the plurality of word lines can be made so that the memory cells are self-aligned. For example, the plurality of semiconductor strips in the ridge-shaped stack can be defined using a single etch mask, resulting in formation of alternating trenches, which can be relatively deep, and stacks in which the side surfaces of the semiconductor strips are vertically aligned or aligned on tapered sides of the ridges that result from the etch. The memory elements can be formed using a layer or layers of material made with blanket deposition processes over the plurality of stacks, and using other processes without a critical alignment step. Also, the plurality of word lines can be formed using a conformal deposition over the layer or layers of material used to provide the memory elements, followed by an etch process to define the lines using a single etch mask. As a result, a 3D array of self-aligned memory cells is established using only one alignment step for the semiconductor strips in the plurality of stacks, and one alignment step for the plurality of word lines.

A combined selection of a particular bit line of a plurality of bit lines, a particular string select line of the plurality of string select lines, and a particular word line of the plurality of word lines, identifies a particular memory cell of the 3D array of memory cells.

Other aspects and advantages of the present invention can be seen on review of the drawings, the detailed description and the claims, which follow.

BRIEF DESCRIPTION OF THE DRAWINGS

FIG. 1 is a perspective illustration of a 3D memory structure as described herein including a plurality of planes of semiconductor strips parallel to a Y-axis, arranged in a plurality of ridge-shaped stacks, a memory layer on side surfaces of the semiconductor strips, and a plurality of word lines with conformal bottom surfaces arranged over the plurality of ridge-shaped stacks.

FIG. 2 is a cross-section of a memory cell taken in the X-Z plane from the structure of FIG. 1.

FIG. 3 is a cross-section of a memory cell taken in the X-Y plane from the structure of FIG. 1.

FIG. 5 is a perspective illustration of a 3D NAND-flash memory structure as described herein including a plurality of planes of semiconductor strips parallel to a Y-axis, arranged in a plurality of ridge-shaped stacks, a charge trapping memory layer on side surfaces of the semiconductor strips, and a plurality of word lines with conformal bottom surfaces arranged over the plurality of ridge-shaped stacks.

FIG. 6 is a cross-section of a memory cell taken in the X-Z plane from the structure of FIG. 5.

FIG. 7 is a cross-section of a memory cell taken in the X-Y plane from the structure of FIG. 5.

DETAILED DESCRIPTION

Figure 4:
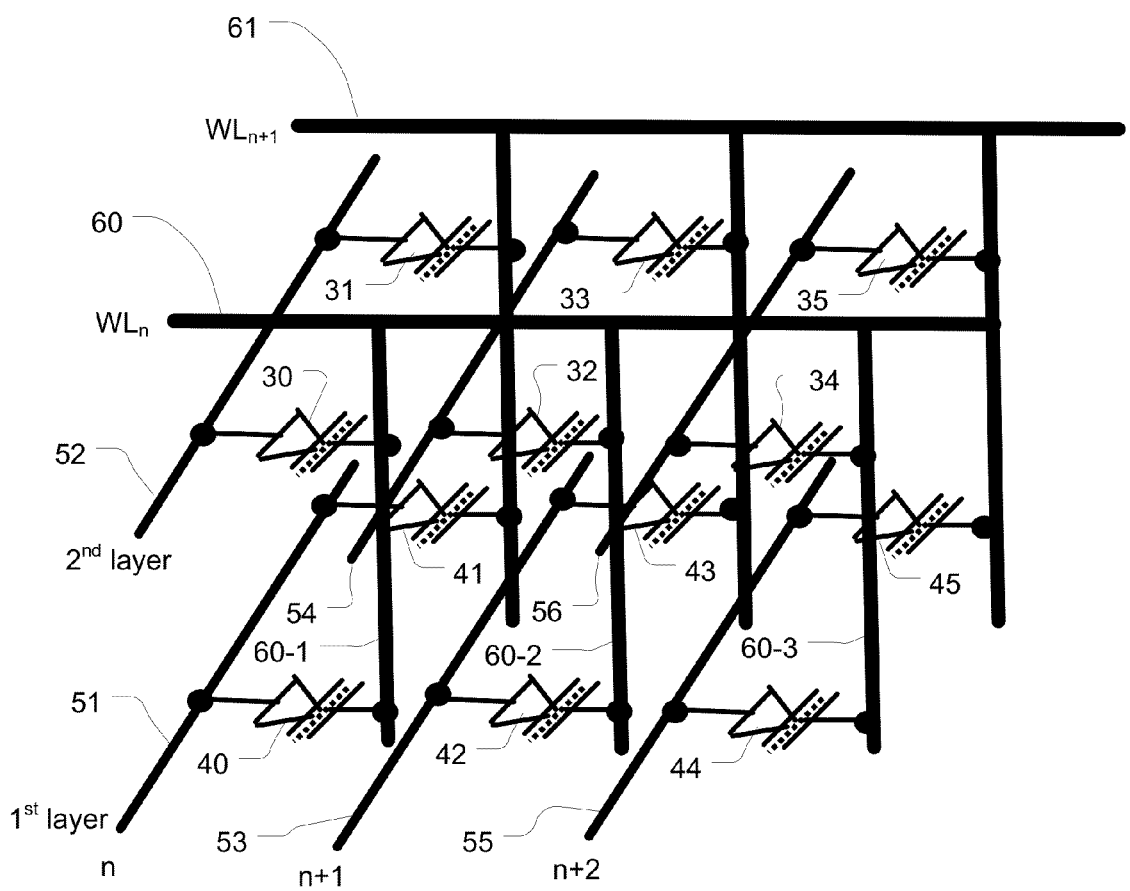
FIG. 4 is a schematic diagram of an anti-fuse based memory having the structure of FIG. 1.

A detailed description of embodiments is provided with reference to the Figures.

FIG. 1 is a perspective drawing of a 2×2 portion of a three-dimensional programmable resistance memory array with fill material removed from the drawing to give a view of the stacks of semiconductor strips and orthogonal word lines that make up the 3D array. In this illustration, only 2 planes are shown. However, the number of planes can be extended to very large numbers. As shown in FIG. 1, the memory array is formed on an integrated circuit substrate having an insulating layer 10 over underlying semiconductor or other structures (not shown). The memory array includes a plurality of stacks of semiconductor strips 11, 12, 13, 14 separated by insulating material 21, 22, 23, 24. The stacks are ridge-shaped extending on the Y-axis as illustrated in the figure, so that the semiconductor strips 11-14 can be configured as memory cell strings. Semiconductor strips 11 and 13 can act as memory cell strings in a first memory plane. Semiconductor strips 12 and 14 can act as memory cell strings in a second memory plane. A layer 15 of memory material, such as an anti-fuse material, coats the plurality of stacks of semiconductor strips in this example, and at least on the side walls of the semiconductor strips in other examples. A plurality of word lines 16, 17 is arranged orthogonally over the plurality of stacks of semiconductor strips. The word lines 16, 17 have surfaces conformal with the plurality of stacks of semiconductor strips, filling the trenches (e.g. 20) defined by the plurality of stacks, and defining a multi-layer array of interface regions at cross-points between side surfaces of the semiconductor strips 11-14 on the stacks and word lines 16, 17. A layer of silicide (e.g. tungsten silicide, cobalt silicide, titanium silicide) 18, 19 can be formed over the top surfaces of the word lines 16, 17.

The layer 15 of memory material can consist of an anti-fuse material such as a silicon dioxide, silicon oxynitride or other silicon oxide, for example having a thickness on the order of 1 to 5 nanometers. Other anti-fuse materials may be used, such as silicon nitride. The semiconductor strips 11-14 can be a semiconductor material with a first conductivity type (e.g. p-type). The word lines 16, 17 can be a semiconductor material with a second conductivity type (e.g. n-type). For example, the semiconductor strips 11-14 can be made using p-type polysilicon while the word lines 16, 17 can be made using relatively heavily doped n+-type polysilicon. The width of the semiconductor strips should be enough to provide room for a depletion region to support the diode operation. As result, memory cells comprising a rectifier formed by the p-n junction with a programmable anti-fuse layer in between the anode and cathode are formed in the 3D array of cross-points between the polysilicon strips and lines. In other embodiments, different programmable resistance memory materials can be used, including transition metal oxides like tungsten oxide on tungsten or doped metal oxide semiconductor strips. Such materials can be programmed and erased, and can be implemented for operations storing multiple bits per cell.

FIG. 2 shows a cross-section view cut in the X-Z plane of the memory cell formed at the intersection of word line 16 and semiconductor strip 14. Active regions 25, 26 are formed on both sides of the strip 14 between the word line 16 and the strip 14. In the native state, a layer 15 of anti-fuse material has a high resistance. After programming, the anti-fuse material breaks down, causing one or both of the active areas 25, 26 within the anti-fuse material to assume a low resistance state. In the embodiment described here, each memory cell has two active regions 25, 26, one on each side of the semiconductor strip 14. FIG. 3 shows a cross-section view in the X-Y plane of the memory cell formed at the intersection of the word lines 16, 17 and the semiconductor strip 14. The current path from the word line defined by the word line 16 through the layer 15 of anti-fuse material and down the semiconductor strip 14 is illustrated.

Electron current as illustrated by the solid arrows in FIG. 3, flows from the n+ word lines 16 into the p-type semiconductor strips, and along the semiconductor strip (--arrow) to sense amplifiers where it can be measured to indicate the state of a selected memory cell. In a typical embodiment, using a layer of silicon oxide about one nanometer thick as the anti-fuse material, a programming pulse may comprise a 5 to 7 volt pulse having a pulse width of about one microsecond, applied under control of on-chip control circuits as described below with reference to FIG. 18. A read pulse may comprise a 1 to 2 volt pulse having a pulse width that depends on the configuration, applied under control of on-chip control circuits as described below with reference to FIG. 18. The read pulse can be much shorter than the programming pulse.

FIG. 4 is a schematic diagram showing 2 planes of memory cells having 6 cells each. The memory cells are represented by diode symbols with a dashed line representing the layer of anti-fuse material between the anode and the cathode. The 2 planes of memory cells are defined at the cross-points of word lines 60, 61 acting as a first word line WLn and a second word line WLn+1 with a first stack of semiconductor strips 51, 52, a second stack of semiconductor strips 53, 54 and a third stack of semiconductor strips 55, 56 acting as memory cell strings n, n+1 and n+2 in first and second layers of the array. The first plane of memory cells includes memory cells 30, 31 on semiconductor strip 52, memory cells 32, 33 on semiconductor strip 54, and memory cells 34, 35 on semiconductor strip 56. The second plane of memory cells includes memory cells 40, 41 on semiconductor strip 51, memory cells 42, 43 on semiconductor strip 53, and memory cells 44, 45 on semiconductor strip 55. As shown in the figure, the word line 60, acting as word line WLn, includes vertical extensions 60-1, 60-2, 60-3 which correspond with the material in the trench 20 shown in FIG. 1 between the stacks in order to couple the word line 60 to the memory cells along the 3 illustrated semiconductor strips in each plane. An array having many layers can be implemented as described herein, enabling very high density memory approaching or reaching terabits per chip.

FIG. 5 is a perspective drawing of a 2×2 portion of a three-dimensional charge trapping memory array with fill material removed from the drawing to give a view of the stacks of semiconductor strips and orthogonal word lines that make up the 3D array. In this illustration, only 2 layers are shown. However, the number of layers can be extended to very large numbers. As shown in FIG. 5, the memory array is formed on an integrated circuit substrate having an insulating layer 110 over underlying semiconductor or other structures (not shown). The memory array includes a plurality of stacks (2 are shown in the drawing) of semiconductor strips 111, 112, 113, 114 separated by insulating material 121, 122, 123, 124. The stacks are ridge-shaped extending on the Y-axis as illustrated in the figure, so that the semiconductor strips 111-114 can be configured as memory cell strings. Semiconductor strips 111 and 113 can act as memory cell strings in a first memory plane. Semiconductor strips 112 and 114 can act as memory cell strings in a second memory plane.

The insulating material 121 between the semiconductor strips 111 and 112 in a first stack and the insulating material 123 between semiconductor strips 113 and 114 in the second stack has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers.

A layer 115 of memory material, such as a dielectric charge trapping structure, coats the plurality of stacks of semiconductor strips in this example. A plurality of word lines 116, 117 is arranged orthogonally over the plurality of stacks of semiconductor strips. The word lines 116, 117 have surfaces conformal with the plurality of stacks of semiconductor strips, filling the trenches (e.g. 120) defined by the plurality of stacks, and defining a multi-layer array of interface regions at cross-points between side surfaces of the semiconductor strips 111-114 on the stacks and word lines 116, 117. A layer of silicide (e.g. tungsten silicide, cobalt silicide, titanium silicide) 118, 119 can be formed over the top surfaces of the word lines 116, 117.

Nanowire MOSFET type cells can also be configured in this manner, by providing nanowire or nanotube structures in channel regions on word lines 111-114, like those described in Paul, et al., "Impact of a Process Variation on Nanowire and Nanotube Device Performance", IEEE Transactions on Electron Devices, Vol. 54, No. 9, September 2007, which article is incorporated by reference as if fully set forth herein.

As a result, a 3D array of SONOS-type memory cells configured in a NAND flash array can formed. The source, drain and channel are formed in the silicon (S) semiconductor strips 111-114, the layer 115 of the memory material includes a tunneling dielectric layer 97 which can be formed of silicon oxide (O), a charge storage layer 98 which can be formed of silicon nitride (N), a blocking dielectric layer 99 which can be formed of silicon oxide (O), and the gate comprises polysilicon (S) of the word lines 116, 117.

The semiconductor strips 111-114 can be a p-type semiconductor material. The word lines 116, 117 can be a semiconductor material with the same or a different conductivity type (e.g. p+-type). For example, the semiconductor strips 111-114 can be made using p-type polysilicon, or p-type epitaxial single crystal silicon, while the word lines 116, 117 can be made using relatively heavily doped p+-type polysilicon.

Alternatively, the semiconductor strips 111-114 can be n-type semiconductor material. The word lines 116, 117 can be a semiconductor material with the same or a different conductivity type (e.g. p+-type). This n-type strip arrangement results in buried-channel, depletion mode charge trapping memory cells. For example, the semiconductor strips 111-114 can be made using n-type polysilicon, or n-type epitaxial single crystal silicon, while the word lines 116, 117 can be made using relatively heavily doped p+-type polysilicon. A typical doping concentration for n-type semiconductor strips can be around $10^{18}/cm^3$, with usable embodiments likely in the range of $10^{17}/cm^3$ to $10^{19}/cm^3$. The use of n-type semiconductor strips can be particularly beneficial in junction-free embodiments to improve conductivity along the NAND strings and thereby allowing higher read current.

Thus, memory cells comprising field effect transistors having charge storage structures are formed in the 3D array of cross-points. Using dimensions for the widths of the semiconductor strips and word lines on the order of 25 nanometers, with gaps between the ridge-shaped stacks on the order of 25 nanometers, a device having a few tens of layers (e.g. 32 layers) can approach terabit capacity ($10^{12}$) in a single chip.

The layer 115 of memory material can comprise other charge storage structures. For example, a bandgap engineered SONOS (BE-SONOS) charge storage structure can be used which includes a dielectric tunneling layer 97 that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 115 in this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer 115 of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material is p+ polysilicon (work function about 5.1 eV) used in the word lines 116, 117.

FIG. 6 shows a cross-section view cut in the X-Z plane of the charge trapping memory cell formed at the intersection of word line 116 and semiconductor strip 114. Active charge trapping regions 125, 126 are formed on the both sides of the strip 114 between the word lines 116 and the strip 114. In the embodiment described here, as shown in FIG. 6, each memory cell is a double gate field effect transistor having active charge storage regions 125, 126, one on each side of the semiconductor strip 114. Electron current as illustrated by the solid arrows in the diagram flows along the p-type semiconductor strips, to sense amplifiers where it can be measured to indicate the state of a selected memory cell.

FIG. 7 shows a cross-section view cut in the X-Y plane of the charge trapping memory cell formed at the intersection of the word lines 116, 117 and the semiconductor strip 114. The current path down the semiconductor strip 114 is illustrated. The source/drain regions 128, 129, 130 between the word lines 116, 117 which act as word lines can be "junction-free", without source and drain doping having a conductivity type opposite that of the channel regions beneath the word lines. In the junction free embodiment, the charge trapping field effect transistors can have a p-type channel structure. Also, source and drain doping could be implemented in some embodiments, in a self-aligned implant after word line definition.

In alternative embodiments, the semiconductor strips 111-114 can be implemented using a lightly doped n-type semiconductor body in junction free arrangements, resulting in a buried-channel field effect transistor which can operate in depletion mode, with naturally shifted lower threshold distributions for the charge trapping cells.

Figure 8:
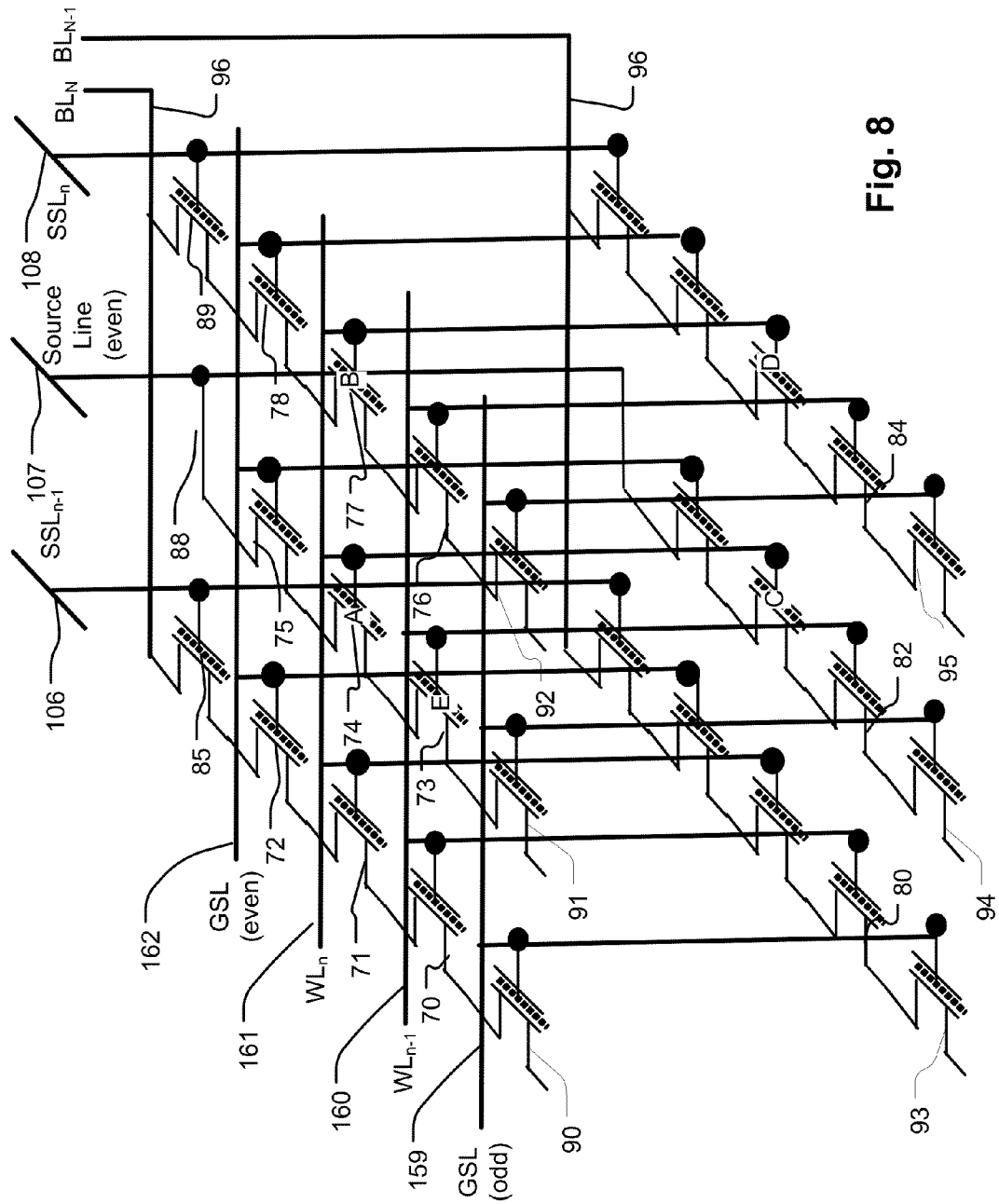
FIG. 8 is a schematic diagram of NAND flash memory having the structure of FIG. 5 and FIG. 23.

FIG. 8 is a schematic diagram showing 2 planes of memory cells having 9 charge trapping cells arranged in a NAND configuration, which is representative of a cube which can include many planes and many word lines. The 2 planes of memory cells are defined at the cross-points of word lines 160, 161 acting as word lines WLn−1, WLn, with a first stack of semiconductor strips, a second stack of semiconductor strips and a third stack of semiconductor strips.

The first plane of memory cells includes memory cells 70, 71 in a NAND string on a semiconductor strip, memory cells 73, 74 in a NAND string on a semiconductor strip, and memory cells 76, 77 in a NAND string on a semiconductor strip. Each NAND string is connected to a ground select transistor on either side (e.g., ground select devices 90, 72 on either side of NAND string 70, 71).

The second plane of memory cells corresponds with a bottom plane in the cube in this example, and includes memory cells (e.g. 80, 82, 84) arranged in NAND strings in a similar manner those in the first plane.

As shown in the figure, the word line 161 acting as word line WLn includes vertical extensions which correspond with the material in the trench 120 shown in FIG. 5 between the stacks, in order to couple the word line 161 to the memory cells (cells 71, 74, 77 in the first plane) in the interface regions in the trenches between the semiconductor strips in all of the planes.

Memory cell strings in adjacent stacks alternate between a bit line end-to-source line end orientation and a source line end-to-bit line end orientation.

Bit lines $BL_N$ and $BL_{N-1}$ terminate the memory cell strings, adjacent to the string select devices. For example, in the top memory plane, bit line $BL_N$ terminates the memory cell strings which have string select transistors 85 and 89. By contrast, the bit line is not connected to trace 88, because the strings of adjacent stacks alternate between a bit line end-to-source line end orientation and a source line end-to-bit line end orientation. So instead for this string, the corresponding bit line is connected to the other end of the string. In the bottom memory plane, bit line $BL_{N-1}$ terminates the memory cell strings which have corresponding string select transistors.

String select transistors 85, 89 are connected between respective NAND strings and string select lines $SSL_{n-1}$ and $SSL_n$ in this arrangement. Likewise, similar string select transistors on a bottom plane in the cube are connected between respective NAND strings and string select lines $SSL_{n-1}$ and $SSL_n$ in this arrangement. String select lines 106, 108, are connected to different ridges, to the gates of string select transistors in each memory cell string, and provide in this example string select signal $SSL_{n-1}$, $SSL_n$ and $SSL_{n+1}$.

By contrast, a string select transistor is not connected to trace 88, because the strings of adjacent stacks alternate between a bit line end-to-source line end orientation and a source line end-to-bit line end orientation. So instead for this string, the corresponding string select transistor is connected to the other end of the string. The NAND string with memory cells 73, 74 also has a string select device, not shown, on the other end of the string. The trace 88 is terminated by a source line 107.

Ground select transistors 90-95 are arranged at the first ends of the NAND strings. Ground select transistors 72, 75, 78 and corresponding second plane ground select transistors are arranged at the second ends of the NAND strings. Accordingly, ground select transistors are on both ends of the memory strings. Depending on the particular end of the memory string, the ground select transistor couples the memory string to a source line, or to a string select device and bit line.

The ground select signal GSL 159 in this example is coupled to the gates of the ground select transistors 90-95, and can be implemented in the same manner as the word lines 160, 161. The string select transistors and ground select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors.

Figure 9:
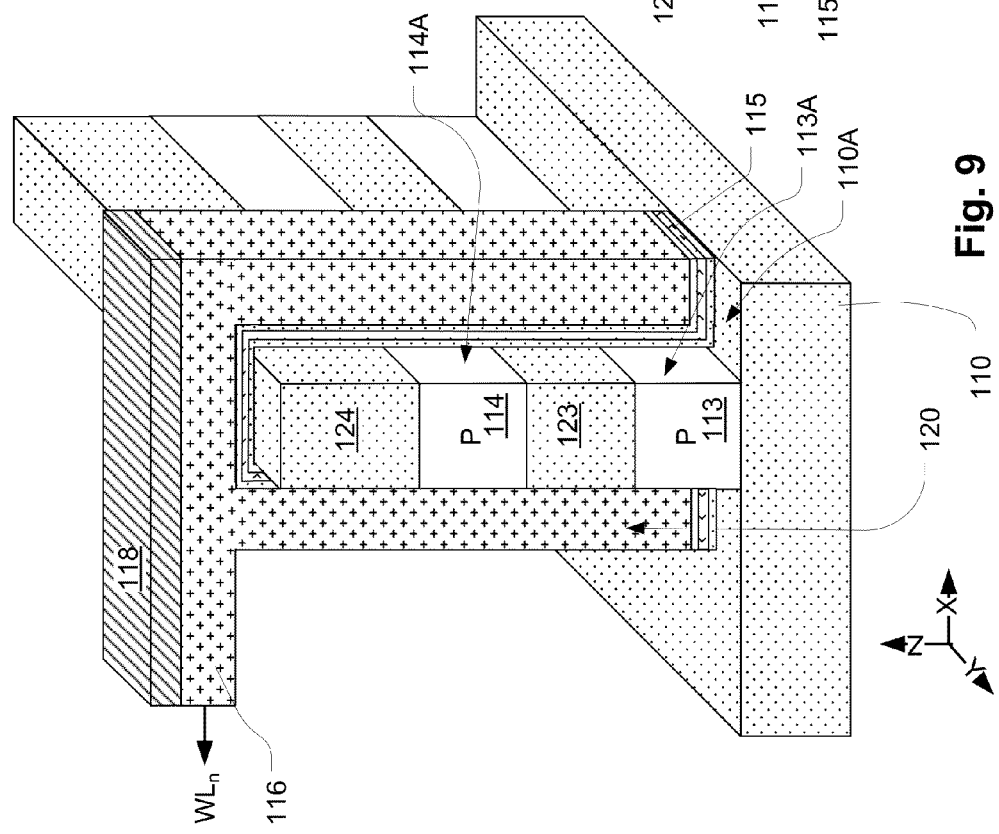
FIG. 9 is a perspective illustration of an alternative implementation of a 3D NAND-flash memory structure like that of FIG. 5, where the memory layer is removed between the word lines.

FIG. 9 is a perspective drawing of an alternative structure like that of FIG. 5. The reference numerals of similar structures are reused in the figure, and not described again. FIG. 9 differs from FIG. 5 in that the surface 110A of the insulating layer 110, and the side surfaces 113A, 114A of the semiconductor strips 113, 114 are exposed between the word lines 116 which act as word lines, as a result of the etch process which forms the word lines. Thus, the layer 115 of memory material can be completely or partially etched between the word lines without harming operation. However, there is no necessity in some structures for etching through the memory layer 115 forming the dielectric charge trapping structures like those described here.

Figure 10:
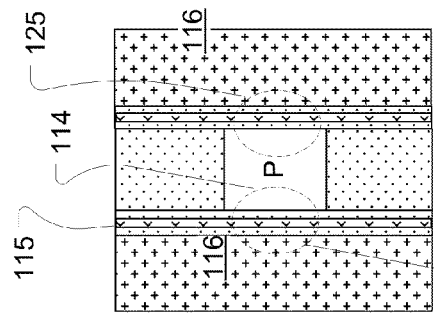
FIG. 10 is a cross-section of a memory cell taken in the X-Z plane from the structure of FIG. 9.
Figure 11:
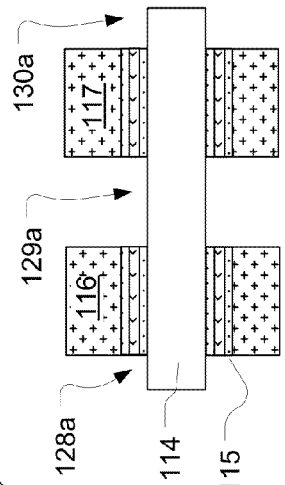
FIG. 11 is a cross-section of a memory cell taken in the X-Y plane from the structure of FIG. 9.

FIG. 10 is a cross-section of a memory cell in the X-Z plane like that of FIG. 6. FIG. 10 is identical to FIG. 6, illustrating that a structure like that of FIG. 9 results in memory cells that are the same as those implemented in the structure of FIG. 5 in this cross-section. FIG. 11 is a cross-section section of a memory cell in the X-Y plane like that of FIG. 7. FIG. 11 differs from FIG. 7 in that the regions 128a, 129a and 130a along the side surfaces (e.g. 114A) of the semiconductor strip 114 may have the memory material removed.

Figure 12:
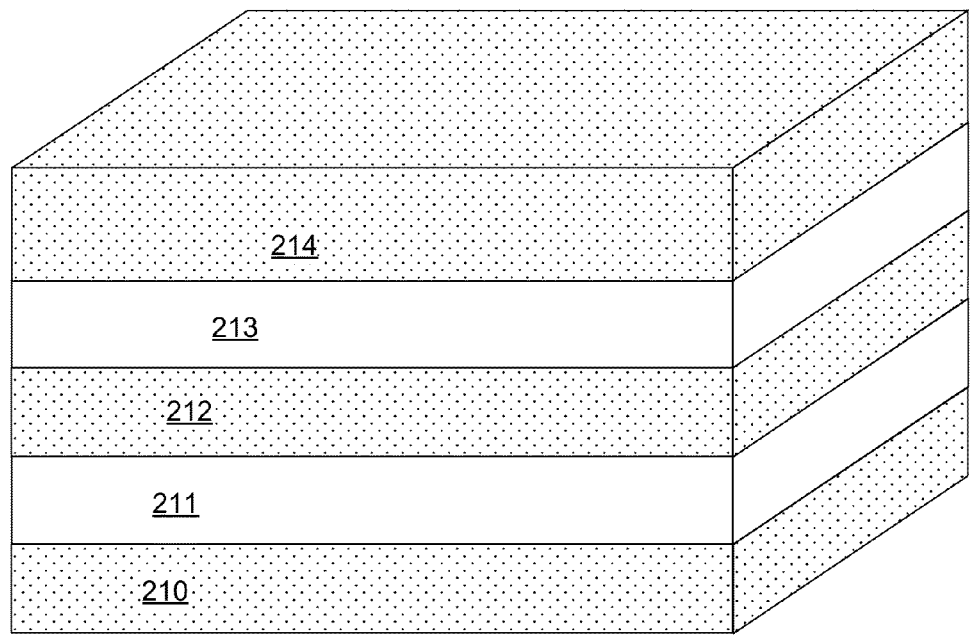
FIG. 12 illustrates a first stage in a process for manufacturing a memory device like that of FIGS. 1, 5 and 9.

FIGS. 12-16 illustrate stages in a basic process flow for implementing 3D memory arrays as described above utilizing only 2 pattern masking steps that are critical alignment steps for array formation. In FIG. 12, a structure is shown which results from alternating deposition of insulating layers 210, 212, 214 and semiconductor layers 211, 213 formed using doped semiconductors for example in a blanket deposition in the array area of a chip. Depending on the implementation, the semiconductor layers 211, 213 can be implemented using polysilicon or epitaxial single crystal silicon having n-type or p-type doping. Inter-level insulating layers 210, 212, 214 can be implemented for example using silicon dioxide, other silicon oxides, or silicon nitride. These layers can be formed in a variety of ways, including low pressure chemical vapor deposition LPCVD processes available in the art.

Figure 13:
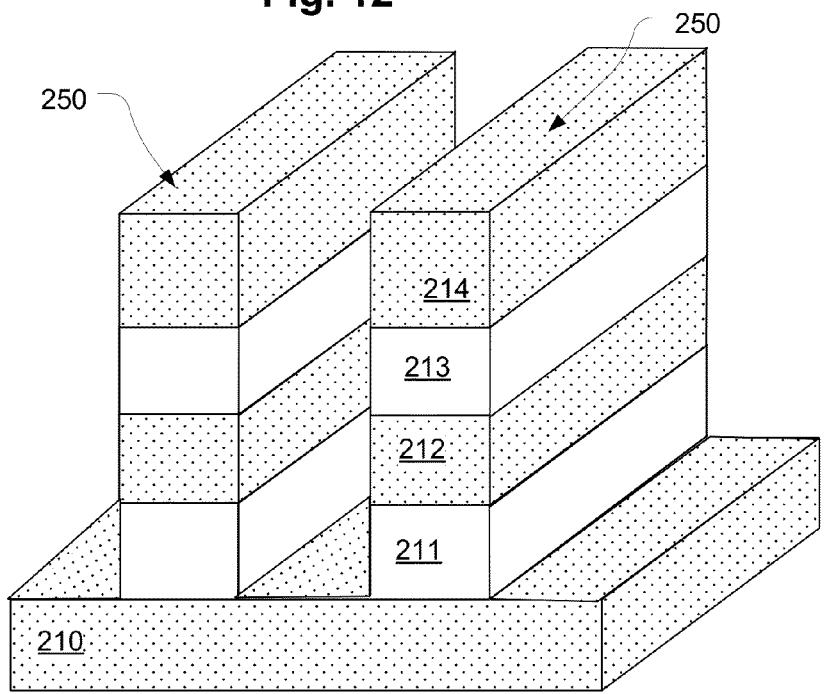
FIG. 13 illustrates a second stage in a process for manufacturing a memory device like that of FIGS. 1, 5 and 9.

FIG. 13 shows the result of a first lithographic patterning step used to define a plurality of ridge-shaped stacks 250 of semiconductor strips, where the semiconductor strips are implemented using the material of the semiconductor layers 211, 213, and separated by the insulating layers 212, 214. Deep, high aspect ratio trenches can be formed in the stack, supporting many layers, using lithography based processes applying a carbon hard mask and reactive ion etching.

Figure 14A:
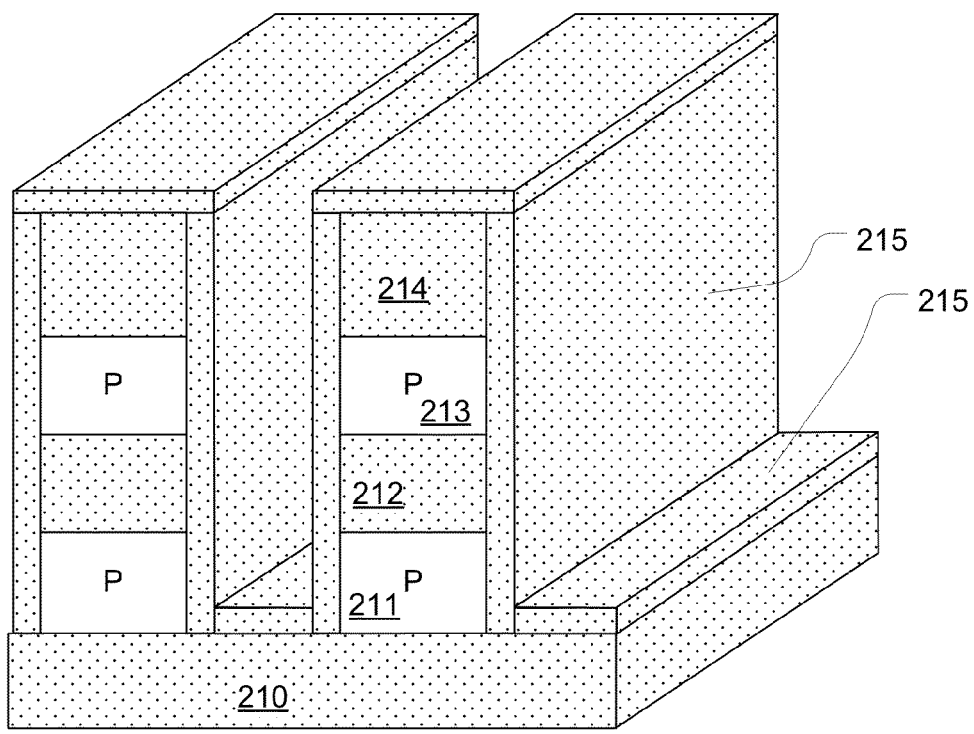
FIG. 14A illustrates a third stage in a process for manufacturing a memory device like that of FIG. 1.
Figure 14B:
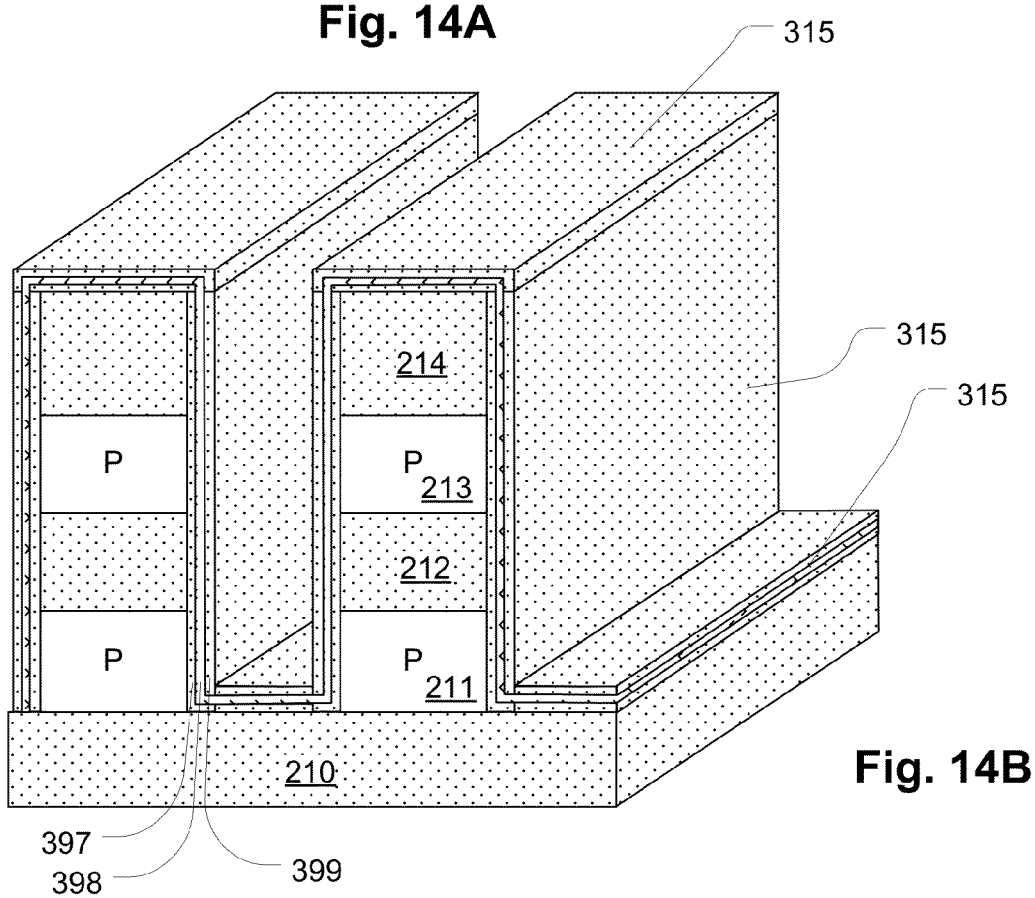
FIG. 14B illustrates a third stage in a process for manufacturing a memory device like that of FIG. 5.

Although not shown, at this step the alternating orientations of the memory strings are defined: the bit line end-to-source line end orientation, and the source line end-to-bit line end orientation FIGS. 14A and 14B show the next stage for, respectively, an embodiment including a programmable resistance memory structure such as an anti-fuse cell structure, and an embodiment including a programmable charge trapping memory structure such as a SONOS type memory cell structure.

FIG. 14A shows results of a blanket deposition of a layer 215 of memory material in an embodiment in which the memory material consists of a single layer as in the case of an anti-fuse structure like that shown in FIG. 1. In an alternative, rather than a blanket deposition, an oxidation process can be applied to form oxides on the exposed sides of the semiconductor strips, where the oxides act as the memory material.

FIG. 14B shows results of blanket deposition of a layer 315 that comprises multilayer charge trapping structure including a tunneling layer 397, a charge trapping layer 398 and a blocking layer 399 as described above in connection with FIG. 4. As shown in FIGS. 14A and 14B, the memory layers 215, 315 are deposited in a conformal manner over the ridge-shaped stacks (250 of FIG. 13) of semiconductor strips.

Figure 15:
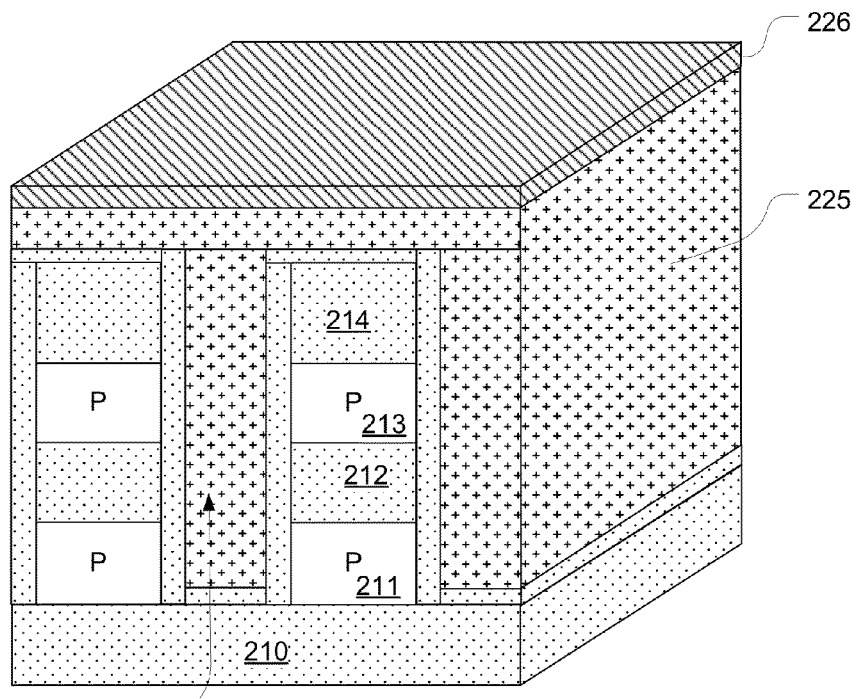
FIG. 15 illustrates a third stage in a process for manufacturing a memory device like that of FIGS. 1, 5 and 9.

FIG. 15 shows the results of a high aspect ratio fill step in which conductive material, such as polysilicon having n-type or p-type doping, to be used for the word lines which act as word lines, is deposited to form layer 225. Also, a layer of silicide 226 can be formed over the layer 225 in embodiments in which polysilicon is utilized. As illustrated in the figure, high aspect ratio deposition technologies such as low-pressure chemical vapor deposition of polysilicon in the illustrated embodiments is utilized to completely fill the trenches 220 between the ridge-shaped stacks, even very narrow trenches on the order of 10 nanometers wide with high aspect ratio.

Figure 16:
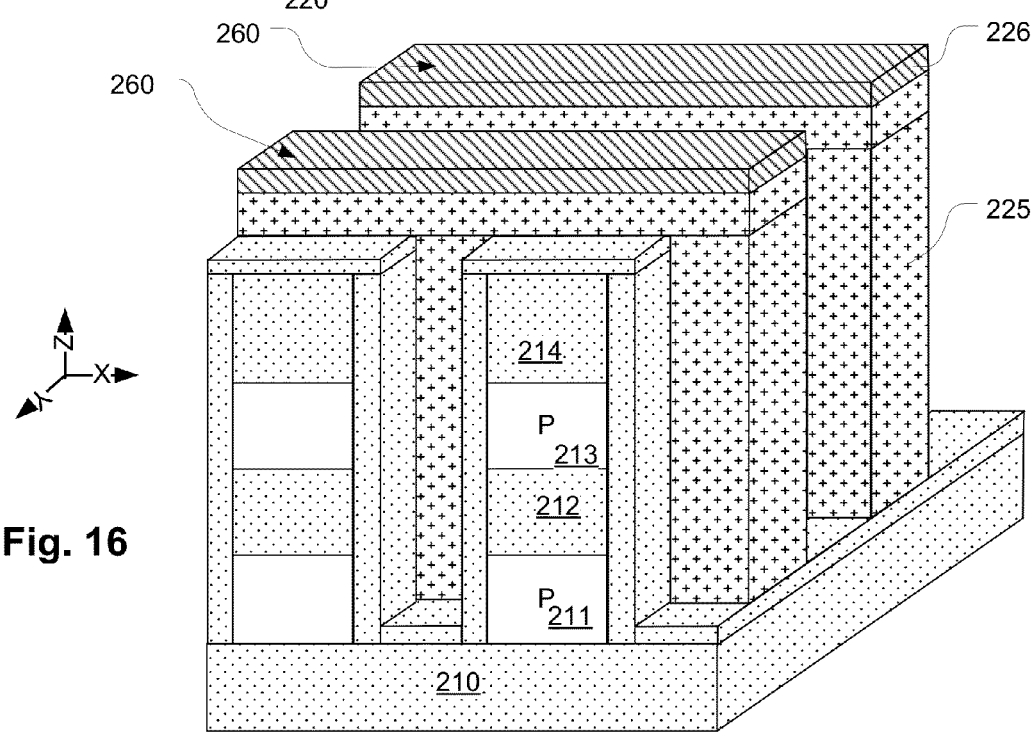
FIG. 16 illustrates a fourth stage in a process for manufacturing a memory device like that of FIGS. 1, 5 and 9, followed by further stages of a hard mask and an optional implant step.

FIG. 16 shows results of the second lithographic patterning step used to define a plurality of word lines 260 which act as word lines for the 3D memory array. The second lithographic patterning step utilizes a single mask for critical dimensions of the array for etching high aspect ratio trenches between the word lines, without etching through the ridge-shaped stacks. Polysilicon can be etched using an etch process that is highly selective for polysilicon over silicon oxides or silicon nitrides. Thus, alternating etch processes are used, relying on the same mask to etch through the conductor and insulating layers, with the process stopping on the underlying insulating layer 210.

At this step, the ground select lines can also be defined. At this step, the gate structures which are controlled by string select lines can also be defined, although the gate structures are conformal to individual semiconductor strip stacks.

An optional manufacturing step includes forming hard masks over the plurality of word lines, and hard masks over the gate structures. The hard masks can be formed using a relatively thick layer of silicon nitride or other material which can block ion implantation processes. After the hard masks are formed, an implant can be applied to increase the doping concentration in the semiconductor strips, and in stairstep structures, and thereby reduce the resistance of the current path along the semiconductor strips. By utilizing controlled implant energies, the implants can be caused to penetrate to the bottom semiconductor strip, and each overlying semiconductor strip in the stacks.

Subsequently, the hard masks are removed, exposing the silicide layers along the top surfaces of the word lines, and over the gate structures. After an interlayer dielectric is formed over the top of the array, vias are opened in which contact plugs, using tungsten fill for example, are formed reaching to the top surfaces of the gate structures. Overlying metal lines are patterned to connect as SSL lines, to column decoder circuits. A three-plane decoding network is established, accessing a selected cell using one word line, one bit line and one SSL line. See, U.S. Pat. No. 6,906,940, entitled Plane Decoding Method and Device for Three Dimensional Memories.

Figure 17:
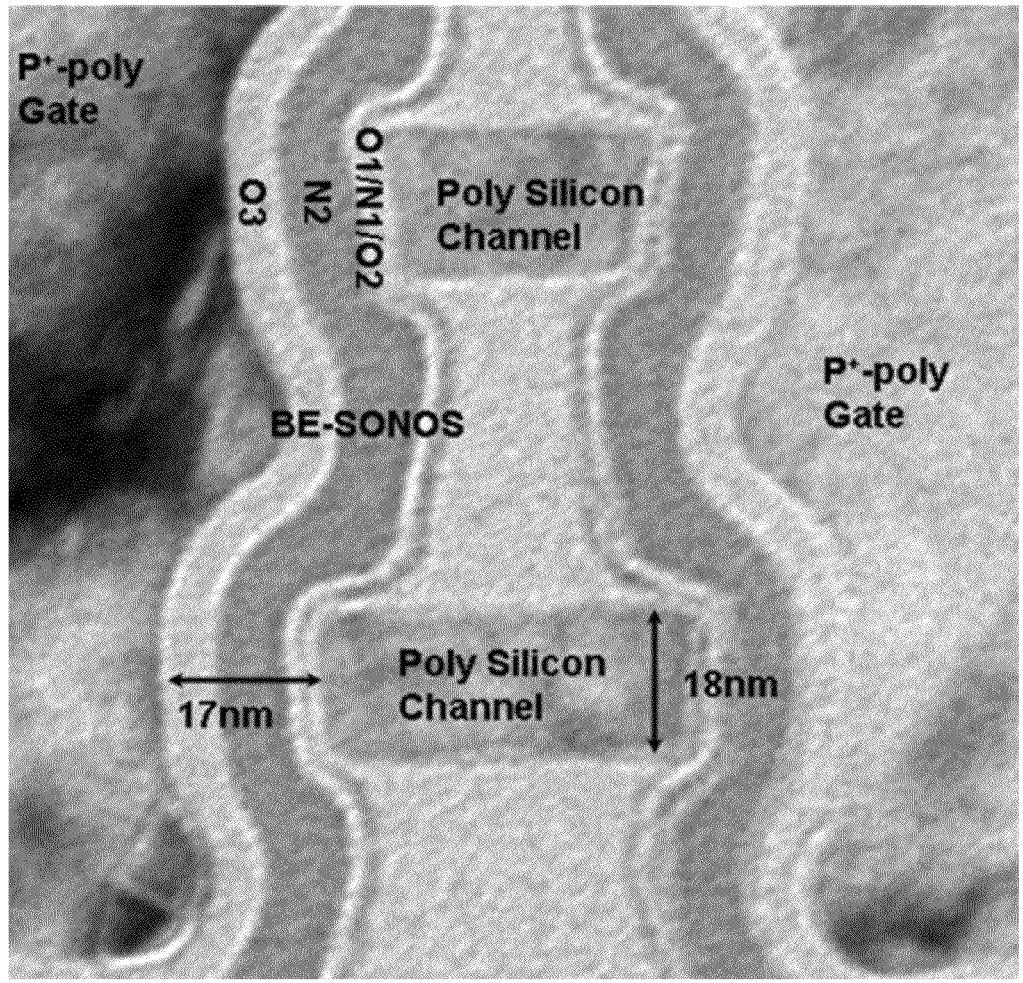
FIG. 17 is a transmission electron microscope TEM image of a portion of 3D NAND-flash memory array.
Figure 30:
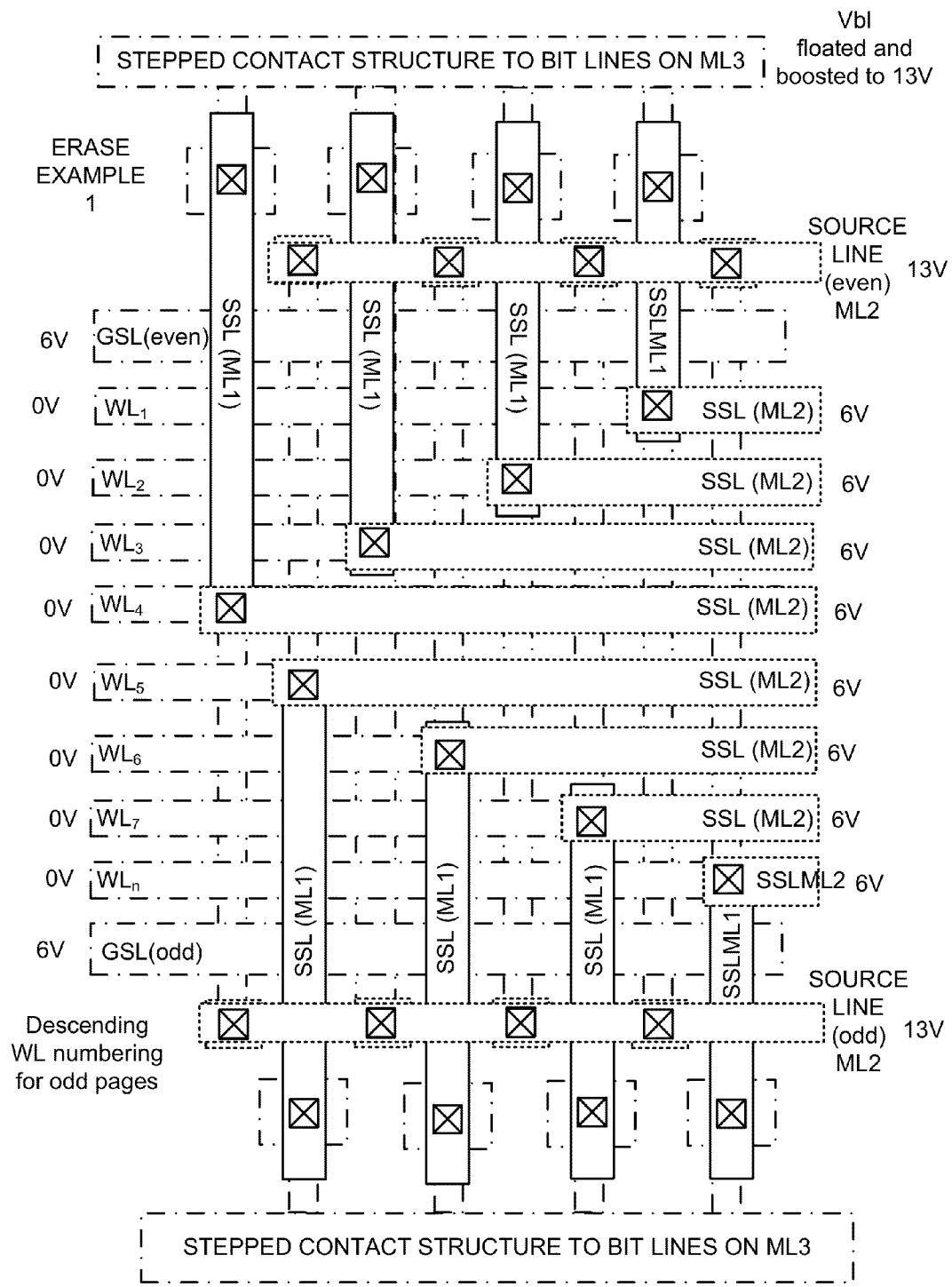

FIG. 17 is a TEM cross-section of a portion of an 8-layer vertical gate, thin-film-transistor, BE-SONOS charge trapping NAND device which has been fabricated and tested. The device was made with a 75 nm half pitch. The channels were n-type polysilicon about 18 nm thick. No additional junction implant was used, resulting in a junction free structure. The insulating material between the strips to isolate the channels in the Z-direction was silicon dioxide was about 40 nm thick. The gates were provided by a p+-polysilicon line. The SSL and GSL devices had longer channel lengths than the memory cells. The test device implemented 32 word line, junction-free NAND strings. The width of the lower strip in FIG. 30 is greater than the width of the upper strip because the trench etch used to form the structure resulted in a tapered side wall with progressively wider strips as the trench becomes deeper, and with the insulating material between the strips being etched more than the polysilicon.

Figure 18:
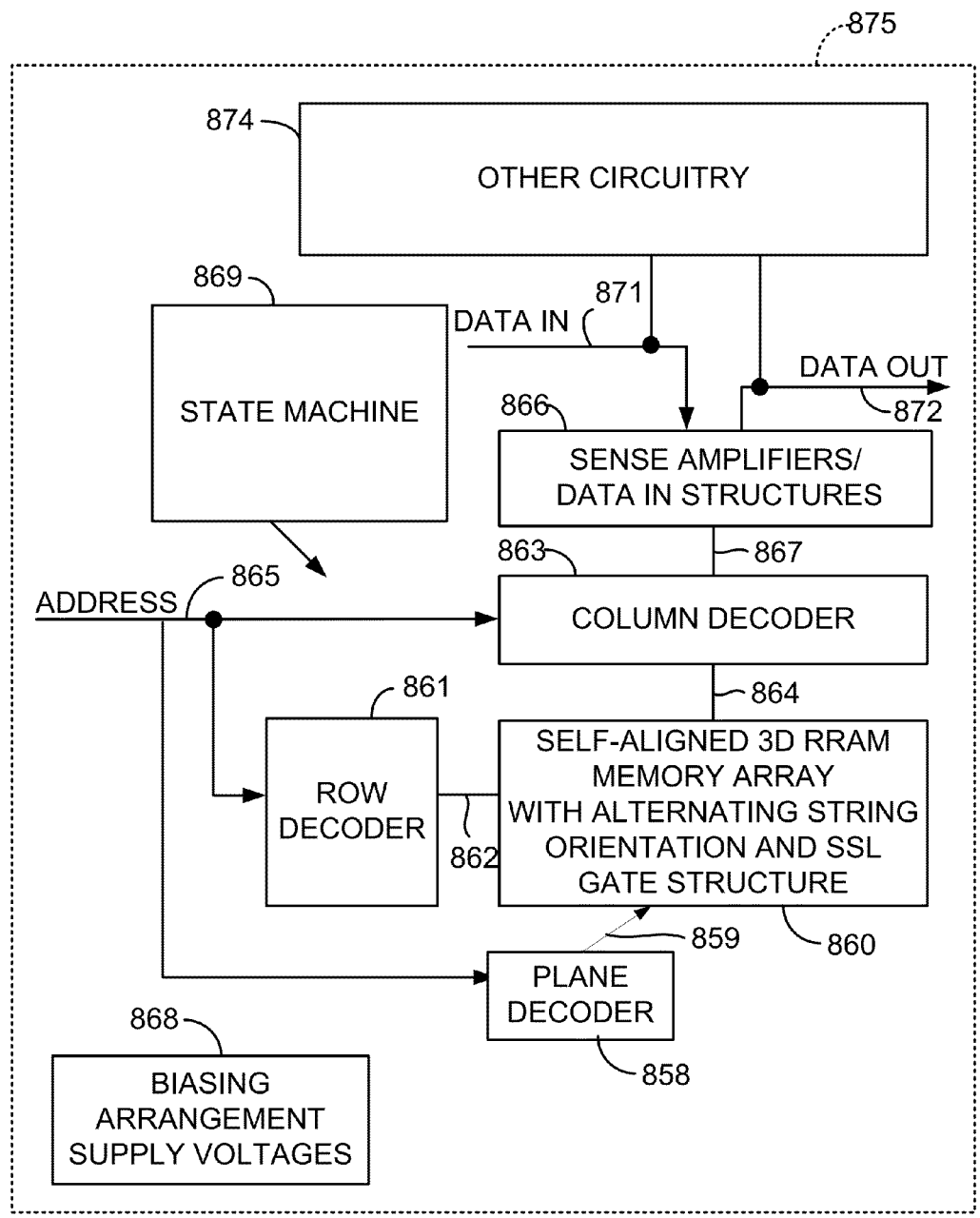
FIG. 18 is a schematic diagram of an integrated circuit including a 3D programmable resistance memory array with row, column and plane decoding circuitry.

FIG. 18 is a simplified block diagram of an integrated circuit according to an embodiment of the present invention. The integrated circuit line 875 includes a 3D programmable resistance memory array 860 (RRAM) implemented as described herein, on a semiconductor substrate, with alternating memory string orientations of bit line end-to-source line end orientation and source line end-to-bit line end orientation, and at either end of the stacks with the string select line gate structure on every other stack. A row decoder 861 is coupled to a plurality of word lines 862, and arranged along rows in the memory array 860. A column decoder 863 is coupled to a plurality of SSL lines 864 arranged along columns corresponding to stacks in the memory array 860 for reading and programming data from the memory cells in the array 860. A plane decoder 858 is coupled to a plurality of planes in the memory array 860 on bit lines 859. Addresses are supplied on bus 865 to column decoder 863, row decoder 861 and plane decoder 858. Sense amplifiers and data-in structures in block 866 are coupled to the column decoder 863 in this example via data bus 867. Data is supplied via the data-in line 871 from input/output ports on the integrated circuit 875 or from other data sources internal or external to the integrated circuit 875, to the data-in structures in block 866. In the illustrated embodiment, other circuitry 874 is included on the integrated circuit, such as a general purpose processor or special purpose application circuitry, or a combination of modules providing system-on-a-chip functionality supported by the programmable resistance cell array. Data is supplied via the data-out line 872 from the sense amplifiers in block 866 to input/output ports on the integrated circuit 875, or to other data destinations internal or external to the integrated circuit 875.

A controller implemented in this example using bias arrangement state machine 869 controls the application of bias arrangement supply voltage generated or provided through the voltage supply or supplies in block 868, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 19:
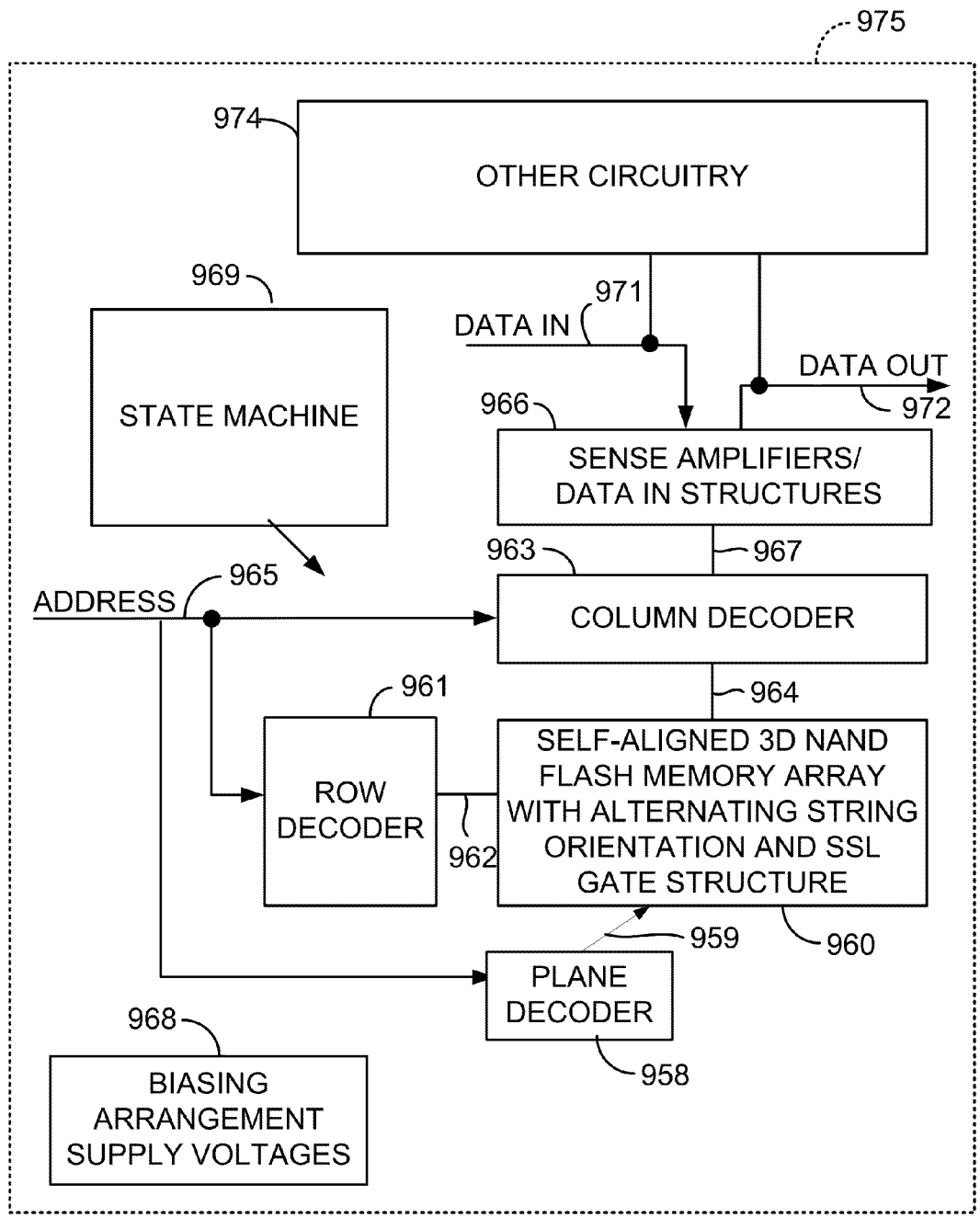
FIG. 19 is a schematic diagram of an integrated circuit including a 3D NAND-flash memory array with row, column and plane decoding circuitry.

FIG. 19 is a simplified block diagram of an integrated circuit according to an embodiment of the present invention. The integrated circuit line 975 includes a 3D NAND flash memory array 960, implemented as described herein, on a semiconductor substrate with alternating memory string orientations of bit line end-to-source line end orientation and source line end-to-bit line end orientation, and at either end of the stacks with the string select line gate structure on every other stack. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 20:
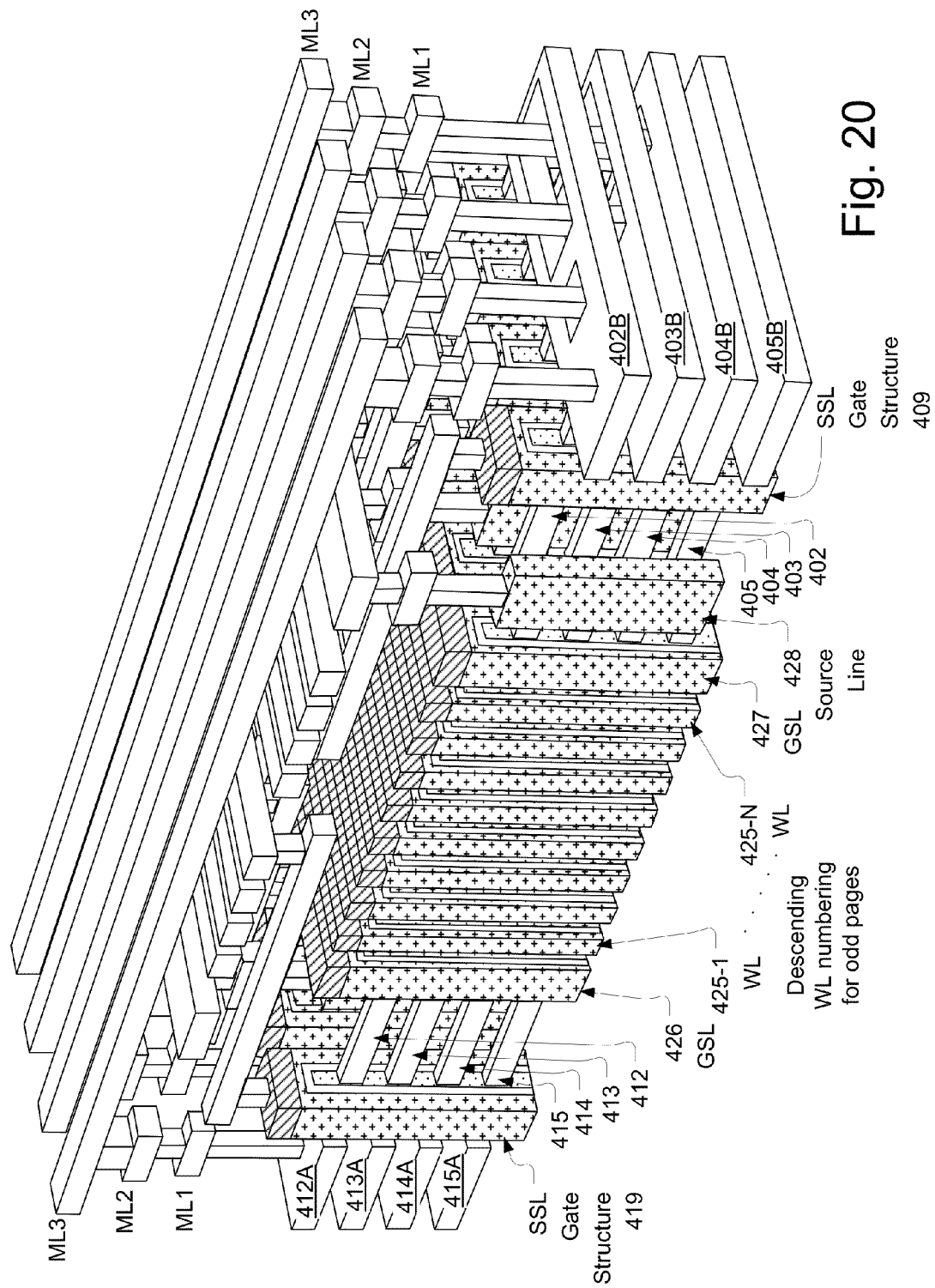
FIGS. 20-22 are illustrations of a first 3D NAND-flash memory array structure with successively higher metal layers of string select lines with a lengthwise orientation parallel to the semiconductor material strips, string select lines with a widthwise orientation parallel to the word lines, and bit lines with a lengthwise orientation parallel to the semiconductor material strips.
Figure 21:
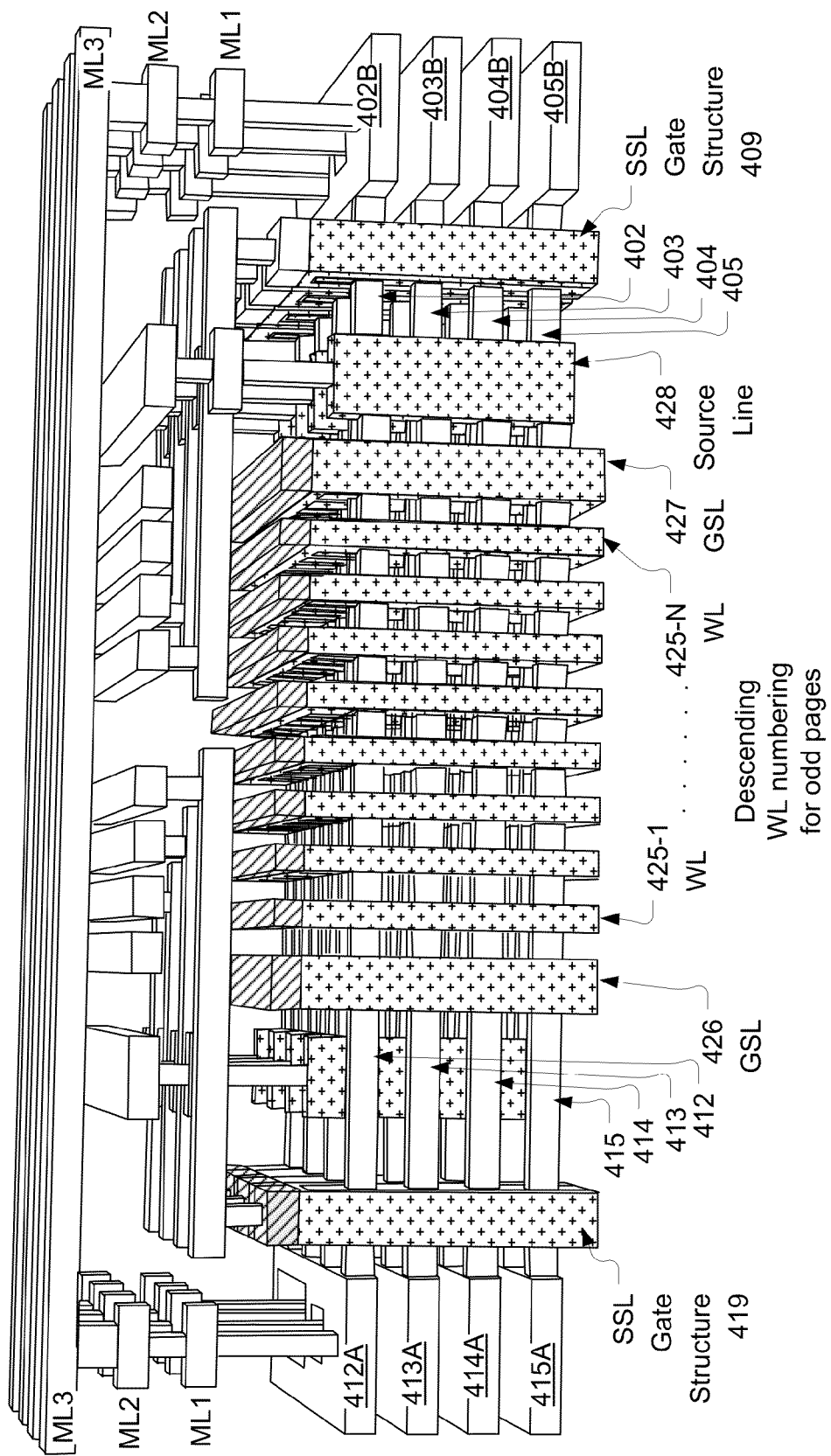
Figure 22:
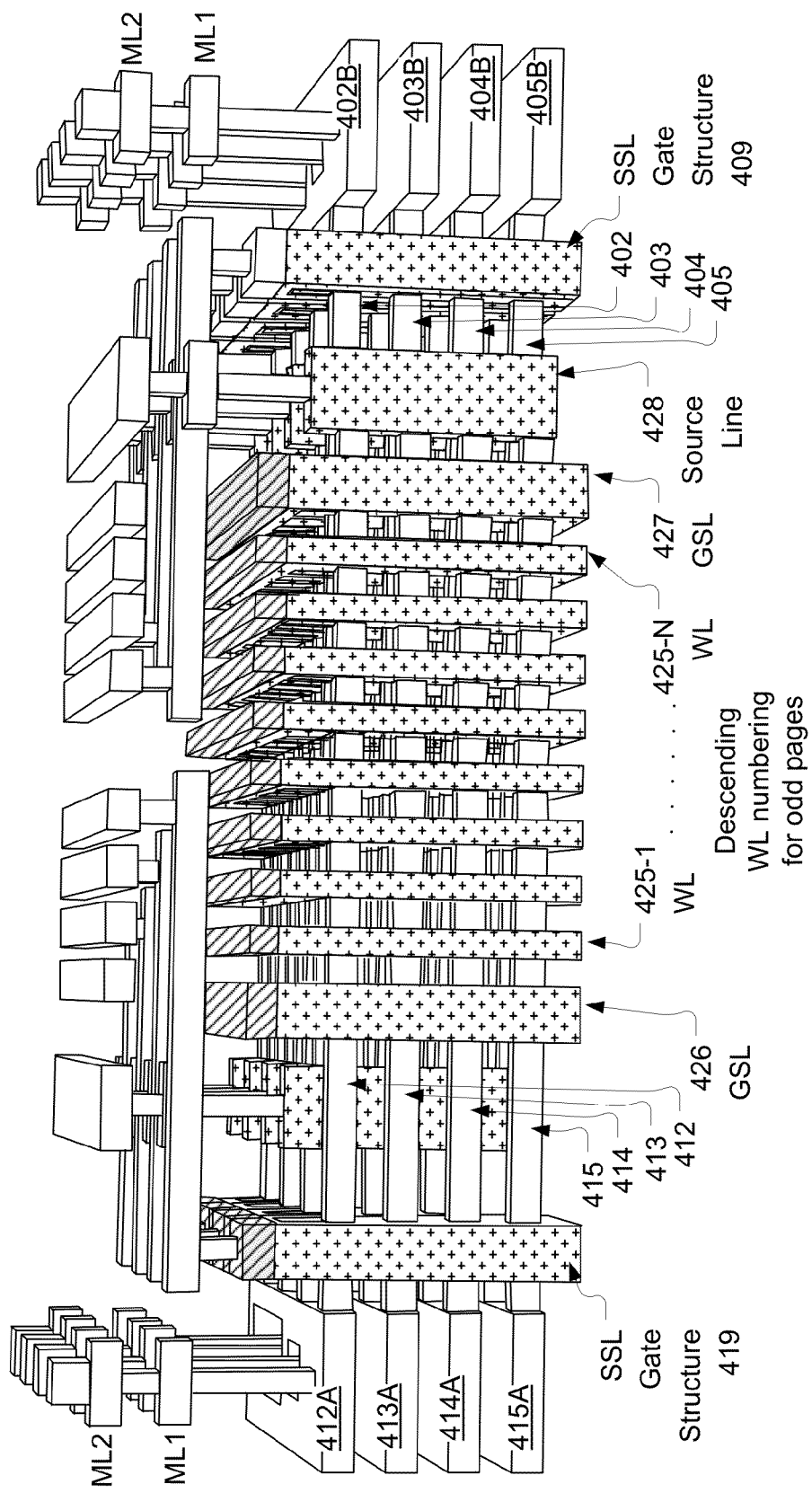
Figure 23:
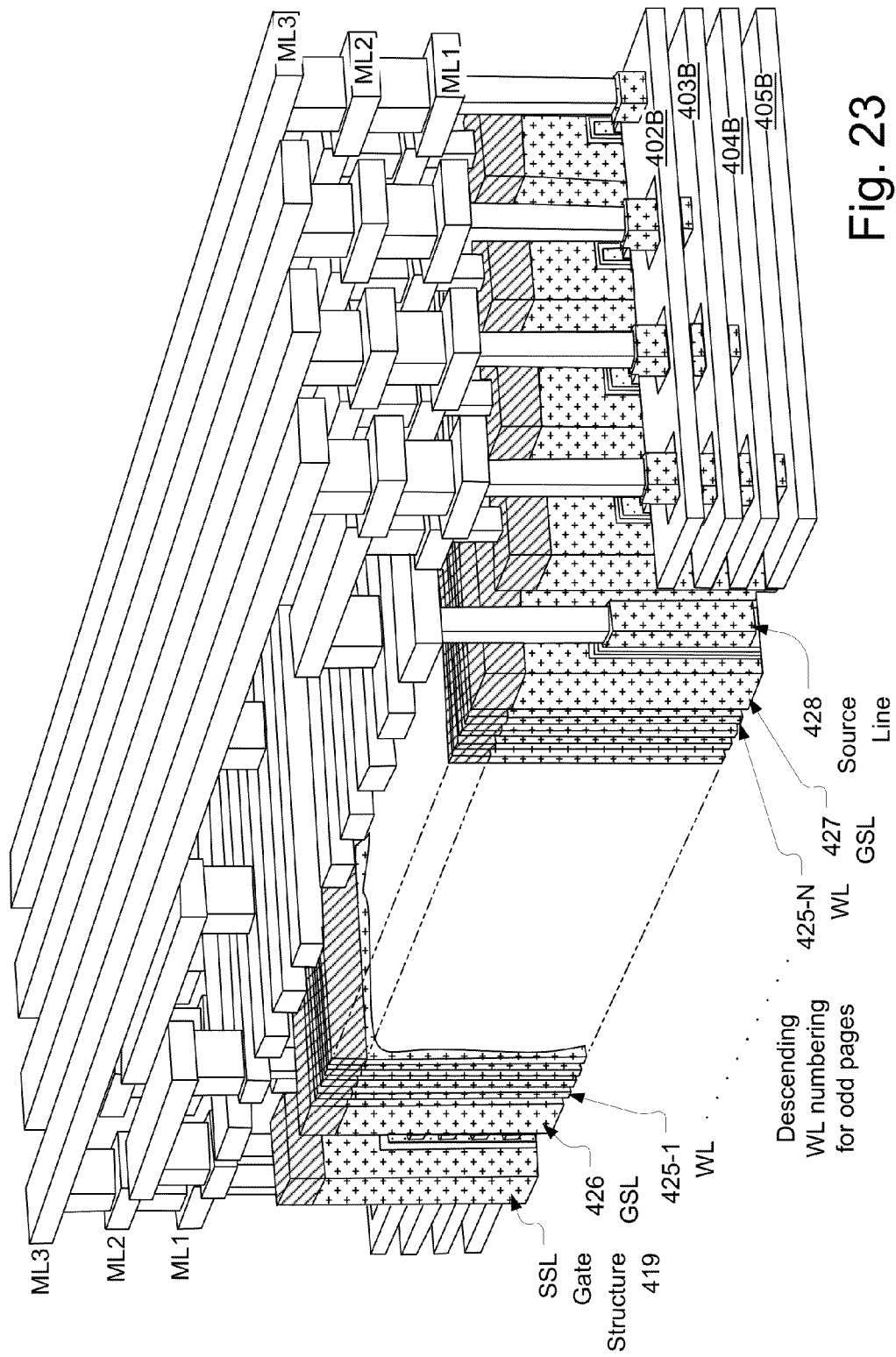
FIGS. 23-26 are illustrations of a second 3D NAND-flash memory array structure with successively higher metal layers of string select lines with a widthwise orientation parallel to the word lines, string select lines with a lengthwise orientation parallel to the semiconductor material strips, and bit lines with a lengthwise orientation parallel to the semiconductor material strips.
Figure 24:
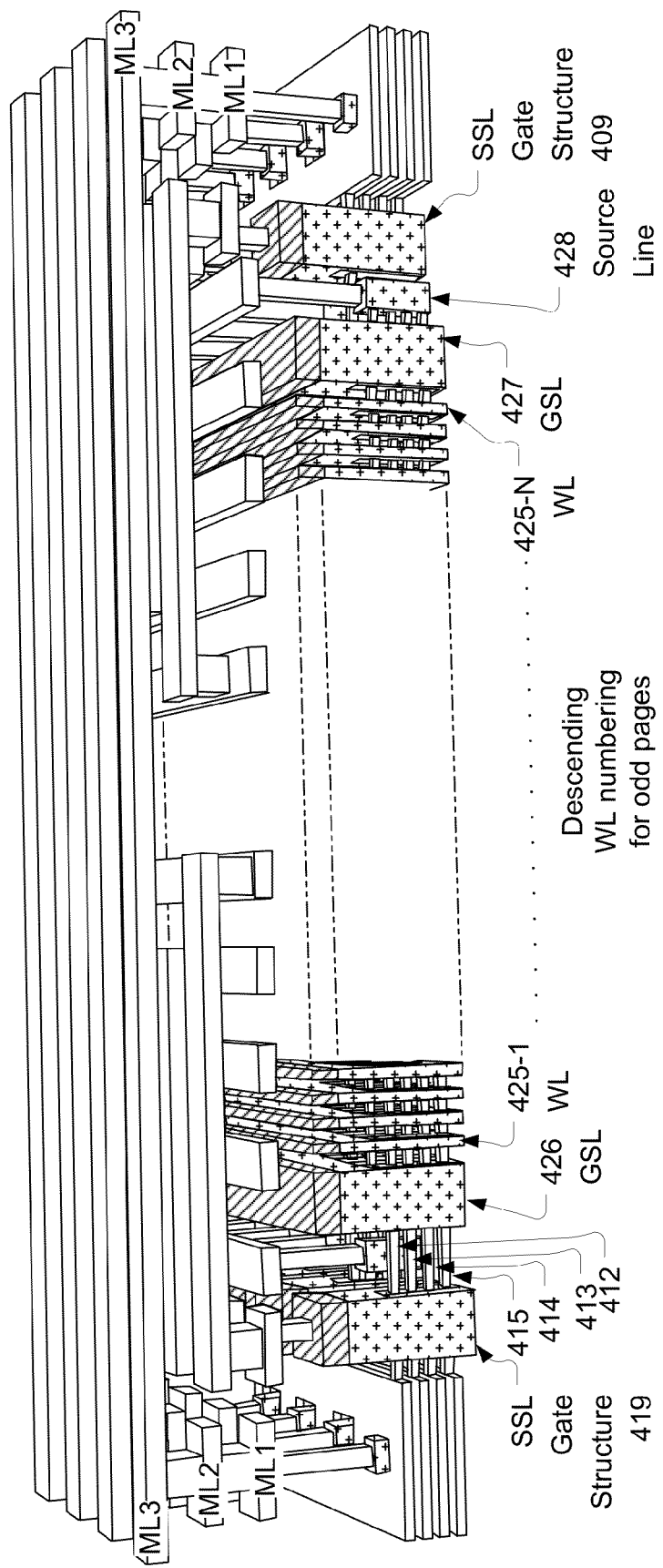
Figure 25:
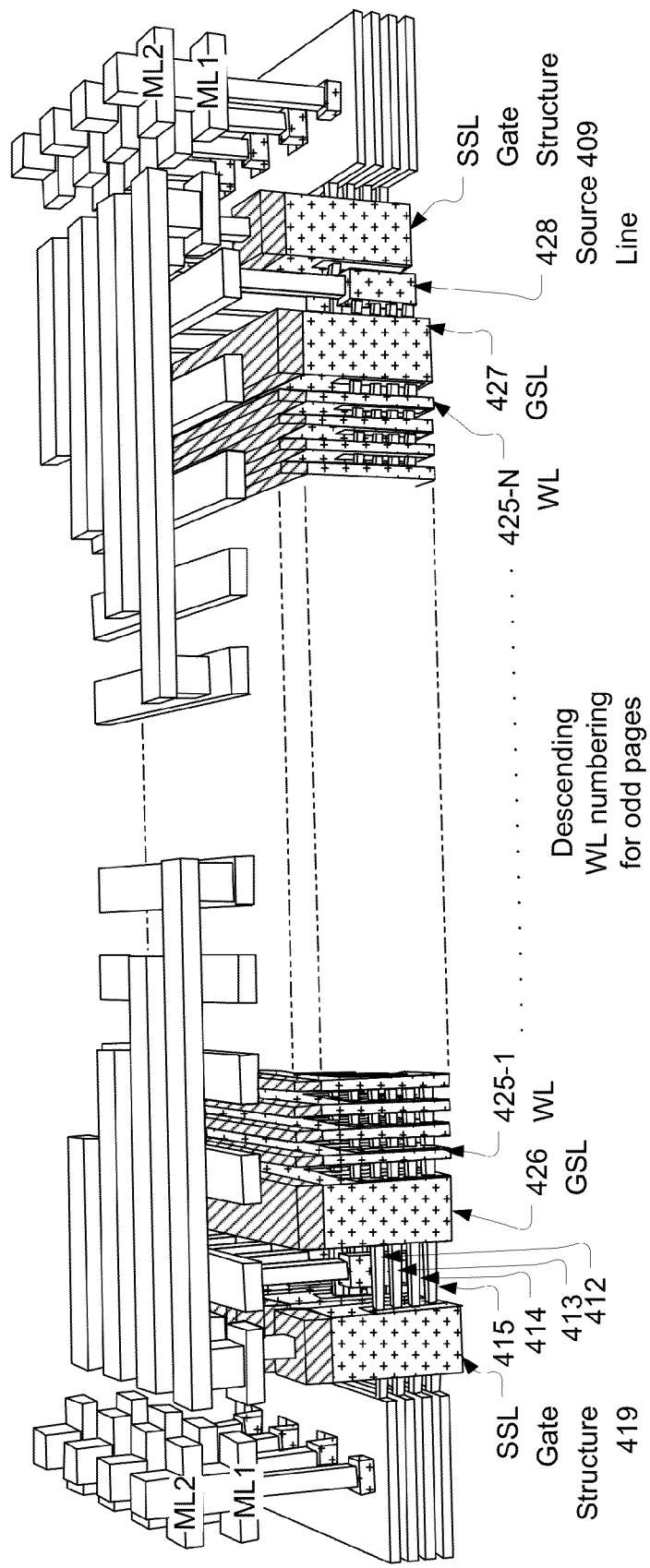

FIGS. 20-22 are illustrations of a first 3D NAND-flash memory array structure with successively higher metal layers of string select lines with a lengthwise orientation parallel to the semiconductor material strips, string select lines with a widthwise orientation parallel to the word lines, and bit lines with a lengthwise orientation parallel to the semiconductor material strips.

FIG. 20 is a perspective illustration of the first 3D NAND-flash memory array structure. Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of word lines 425-1, . . . , 425-$n$-1, 425-$n$ conformal with the plurality of ridge-shaped stacks, and which act as word lines WLn, WLn−1, . . . WL1. The plurality of ridge-shaped stacks includes semiconductor strips 412, 413, 414, 415. Semiconductor strips in the same plane are electrically coupled together by stairstep structures.

The shown word line numbering, ascending from 1 to N going from the back to the front of the overall structure, applies to even memory pages. For odd memory pages, the word line numbering descends from N to 1 going from the back to the front of the overall structure.

Stairstep structures 412A, 413A, 414A, 415A terminate semiconductor strips, such as semiconductor strips 412, 413, 414, 415. As illustrated, these stairstep structures 412A, 413A, 414A, 415A are electrically connected to different bit lines for connection to decoding circuitry to select planes within the array. These stairstep structures 412A, 413A, 414A, 415A can be patterned at the same time that the plurality of ridge-shaped stacks are defined.

Stairstep structures 402B, 403B, 404B, 405B terminate semiconductor strips, such as semiconductor strips 402, 403, 404, 405. As illustrated, these stairstep structures 402B, 403B, 404B, 405B are electrically connected to different bit lines for connection to decoding circuitry to select planes within the array. These stairstep structures 402B, 403B, 404B, 405B can be patterned at the same time that the plurality of ridge-shaped stacks are defined.

Any given stack of semiconductor strips is coupled to either the stairstep structures 412A, 413A, 414A, 415A, or the stairstep structures 402B, 403B, 404B, 405B, but not both. A stack of semiconductor strips has one of the two opposite orientations of bit line end-to-source line end orientation, or source line end-to-bit line end orientation. For example, the stack of semiconductor strips 412, 413, 414, 415 has bit line end-to-source line end orientation; and the stack of semiconductor strips 402, 403, 404, 405 has source line end-to-bit line end orientation.

The stack of semiconductor strips 412, 413, 414, 415 is terminated at one end by the stairstep structures 412A, 413A, 414A, 415A, passes through SSL gate structure 419, gate select line GSL 426, word lines 425-1 WL through 425-N WL, gate select line GSL 427, and terminated at the other end by source line 428. The stack of semiconductor strips 412, 413, 414, 415 does not reach the stairstep structures 402B, 403B, 404B, 405B.

The stack of semiconductor strips 402, 403, 404, 405 is terminated at one end by the stairstep structures 402B, 403B, 404B, 405B, passes through SSL gate structure 409, gate select line GSL 427, word lines 425-N WL through 425-1 WL, gate select line GSL 426, and terminated at the other end by a source line (obscured by other parts of figure). The stack of semiconductor strips 402, 403, 404, 405 does not reach the stairstep structures 412A, 413A, 414A, 415A.

A layer of memory material separates the word lines 425-1 through 425-n, from the semiconductor strips 412-415 and 402-405 as described in detail in prior figures. Ground select lines GSL 426 and GSL 427 are conformal with the plurality of ridge-shaped stacks, similar to the word lines.

Every stack of semiconductor strips is terminated at one end by stairstep structures, and at the other end by a source line. For example, the stack of semiconductor strips 412, 413, 414, 415 is terminated at one end by stairstep structures 412A, 413A, 414A, 415A, and terminated on the other end by source line 428. At the near end of the figure, every other stack of semiconductor strips is terminated by the stairstep structures 402B, 403B, 404B, 405B; and every other stack of semiconductor strips is terminated by a separate source line. At the far end of the figure, every other stack of semiconductor strips is terminated by the stairstep structures 412A, 413A, 414A, 415A; and every other stack of semiconductor strips is terminated by a separate source line.

Bit lines and string select lines are formed at the metals layers ML1, ML2, and ML3; and are discussed in further figures below with better visibility.

Transistors are formed between the stairstep structures 412A, 413A, 414A and the word line 425-1. In the transistors, the semiconductor strip (e.g. 413) acts as the channel region of the device. SSL gate structures (e.g. 419, 409) are patterned during the same step that the word lines 425-1 through 425-n are defined. A layer of silicide 426 can be formed along the top surface of the word lines, the ground select lines, and over the gate structures 429. The layer of memory material 415 can act as the gate dielectric for the transistors. These transistors act as string select gates coupled to decoding circuitry for selecting particular ridge-shaped stacks in the array.

FIGS. 21 and 22 are side illustrations of the first 3D NAND-flash memory array structure shown in FIG. 20. FIG. 21 shows all three metal layers ML1, ML2, ML3. FIG. 22 shows the lower two metal layers ML1, ML2, with the third metal layer ML3 removed for easier viewing of the remainder.

The first metal layer ML1 includes string select lines with a lengthwise orientation parallel to the semiconductor material strips. These ML1 string select lines are connected by short vias to different SSL gate structures (e.g., 409, 419).

The second metal layer ML2 includes string select lines with a widthwise orientation parallel to the word lines. These ML2 string select lines are connected by short vias to different ML1 string select lines.

In combination, these ML1 string select lines and ML2 string select lines allow a string select line signal to select a particular stack of semiconductor strips.

The first metal layer ML1 also includes two source lines with a widthwise orientation parallel to the word lines.

Finally, the third metal layer ML3 includes bit lines with a lengthwise orientation parallel to the semiconductor material strips. Different bit lines are electrically connected to different steps of the stairstep structures 412A, 413A, 414A, 415A and 402B, 403B, 404B, 405B. These ML3 bit lines allow a bit line signal to select a particular horizontal plane of semiconductor strips.

Because a particular word line allows a word line to select a particular row plane of memory cells, the threefold combination of word line signals, bit line signals, and string select line signals is sufficient to select a particular memory cell from the 3D array of memory cells.

FIGS. 23-26 are illustrations of a second 3D NAND-flash memory array structure with successively higher metal layers of string select lines with a widthwise orientation parallel to the word lines, string select lines with a lengthwise orientation parallel to the semiconductor material strips, and bit lines with a lengthwise orientation parallel to the semiconductor material strips.

Figure 26:
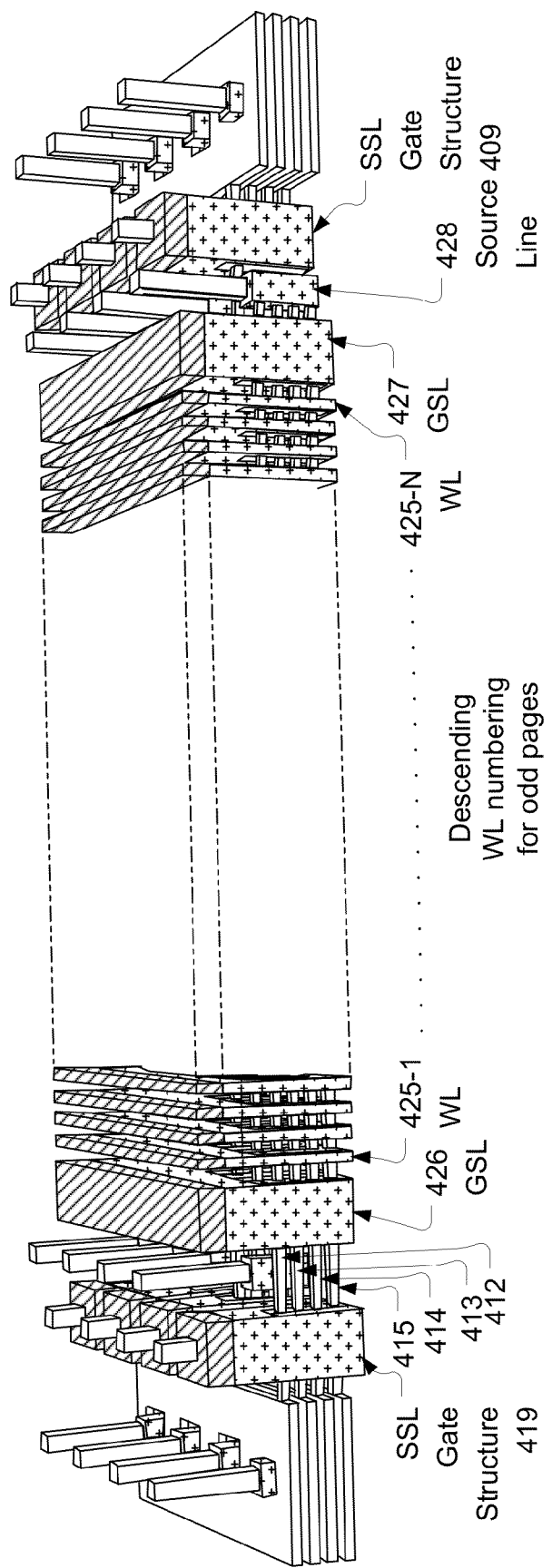

The second 3D NAND-flash memory array shown by FIGS. 23-26 is broadly similar to the first 3D NAND-flash memory array shown by FIGS. 20-22. FIG. 26 further removes all three metal layers ML1, ML2, ML3 for improved visibility.

However, whereas the first 3D NAND-flash memory array shown by FIGS. 20-22 shows eight word lines, the second 3D NAND-flash memory array shown by FIGS. 23-26 shows thirty two word lines. Other embodiments have different numbers of word lines, bit lines, and string select lines, and correspondingly different numbers of semiconductor strip stacks etc.

Also, whereas the first 3D NAND-flash memory array shown by FIGS. 20-22 shows metal contact plugs which connect the ML3 bit lines to different steps of the stairstep structures, the second 3D NAND-flash memory array shown by FIGS. 23-26 shows connects the contact plugs to the different steps of the stairstep structures with polysilicon plugs.

Further, whereas the first 3D NAND-flash memory array shown by FIGS. 20-22 has string select lines which lead to the decoder at ML2, and the string select lines which lead to the SSL gate structures on ML1; the second 3D NAND-flash memory array shown by FIGS. 23-26 has string select lines which lead to the decoder at ML1, and the string select lines which lead to the SSL gate structures on ML2.

FIGS. 27-31 are layout views of the first 3D NAND-flash memory array structure of FIGS. 20-22, with various bias arrangements.

Figure 27:
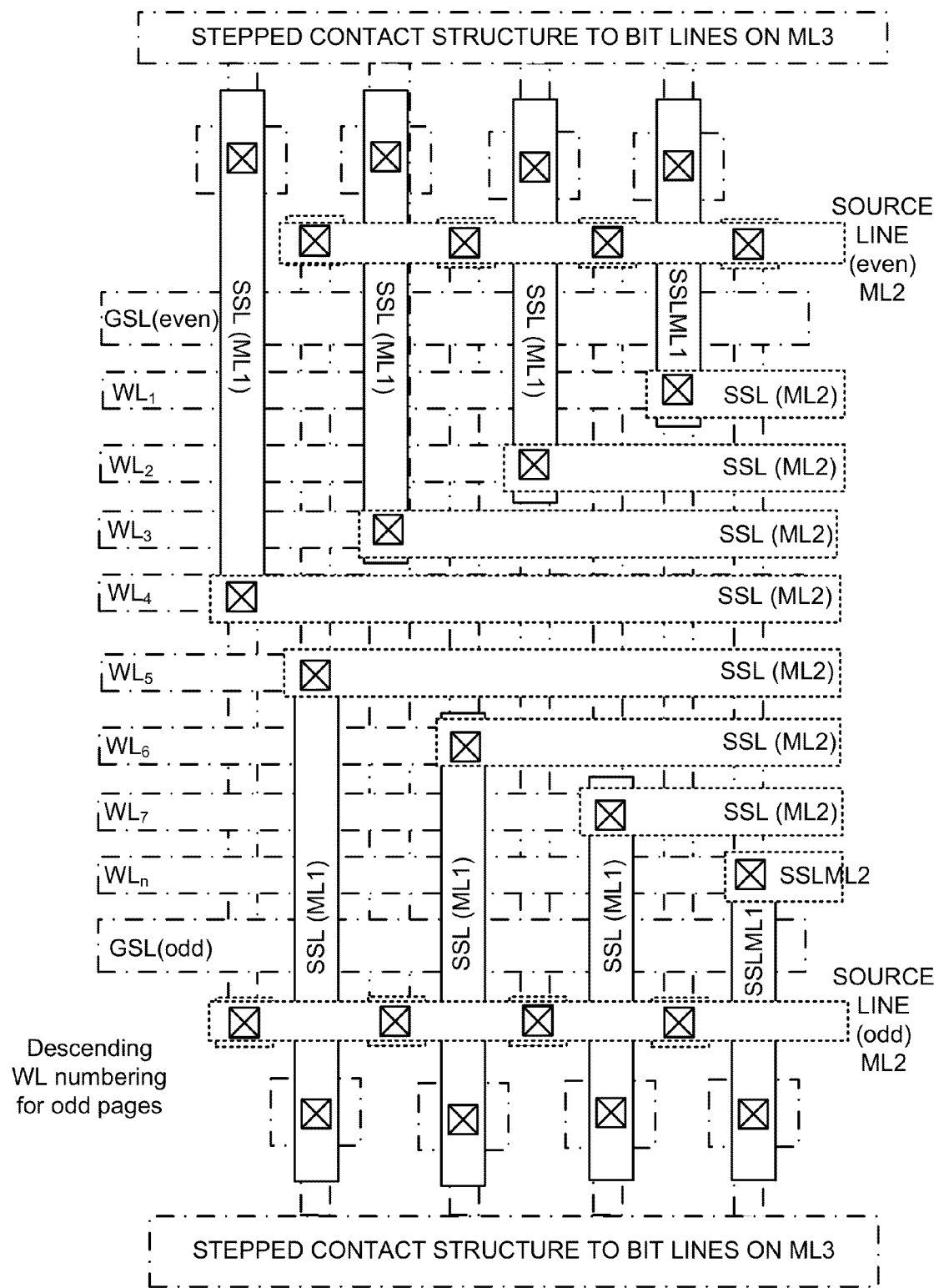
FIGS. 27-31 are layout views of the first 3D NAND-flash memory array structure of FIGS. 20-22, with various bias arrangements.

In the layout view of FIG. 27, the stacks of semiconductor strips are shown as vertical strips with dot-dash borders. Adjacent stacks of semiconductor strips alternate between the opposite orientations, of bit line end-to-source line end orientation, and source line end-to-bit line end orientation. Every other stack of semiconductor strips runs from the bit line structure at the top, to the source line at the bottom. Every other stack of semiconductor strips runs from the source line at the top, to the bit line structure at the bottom.

Overlying the stacks of semiconductor strips, are the horizontal word lines and the horizontal ground select lines GSL (even) and GSL (odd). Also overlying the stacks of semiconductor strips, are the SSL gate structures. The SSL gate structures overlie every other stack of semiconductor strips at the top end of the semiconductor strips, and overlie every other stack of semiconductor strips at the bottom end of the semiconductor strips. In either case, the SSL gate structures control electrical connection between any stack of semiconductor strips and the stack's corresponding bit line contact structure.

The shown word line numbering, ascending from 1 to N going from the top of the figure to the bottom of the figure, applies to even memory pages. For odd memory pages, the word line numbering descends from N to 1 going from the top of the figure to the bottom of the figure.

Overlying the word lines, ground select lines, and SSL gate structures, are the ML1 SSL string select lines running vertically. Overlying the ML1 SSL string select lines are the ML2 SSL string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couples these decoder signals to particular SSL gate structures to select particular stacks of semiconductor strips.

Also overlying the ML1 SSL string select lines are the source lines, even and odd.

Further, overlying the ML2 SSL string select lines are the ML3 bit lines (not shown) which connect to the stepped contact structures at the top and the bottom. Through the stepped contact structures, the bit lines select particular planes of semiconductor strips.

Figure 28:
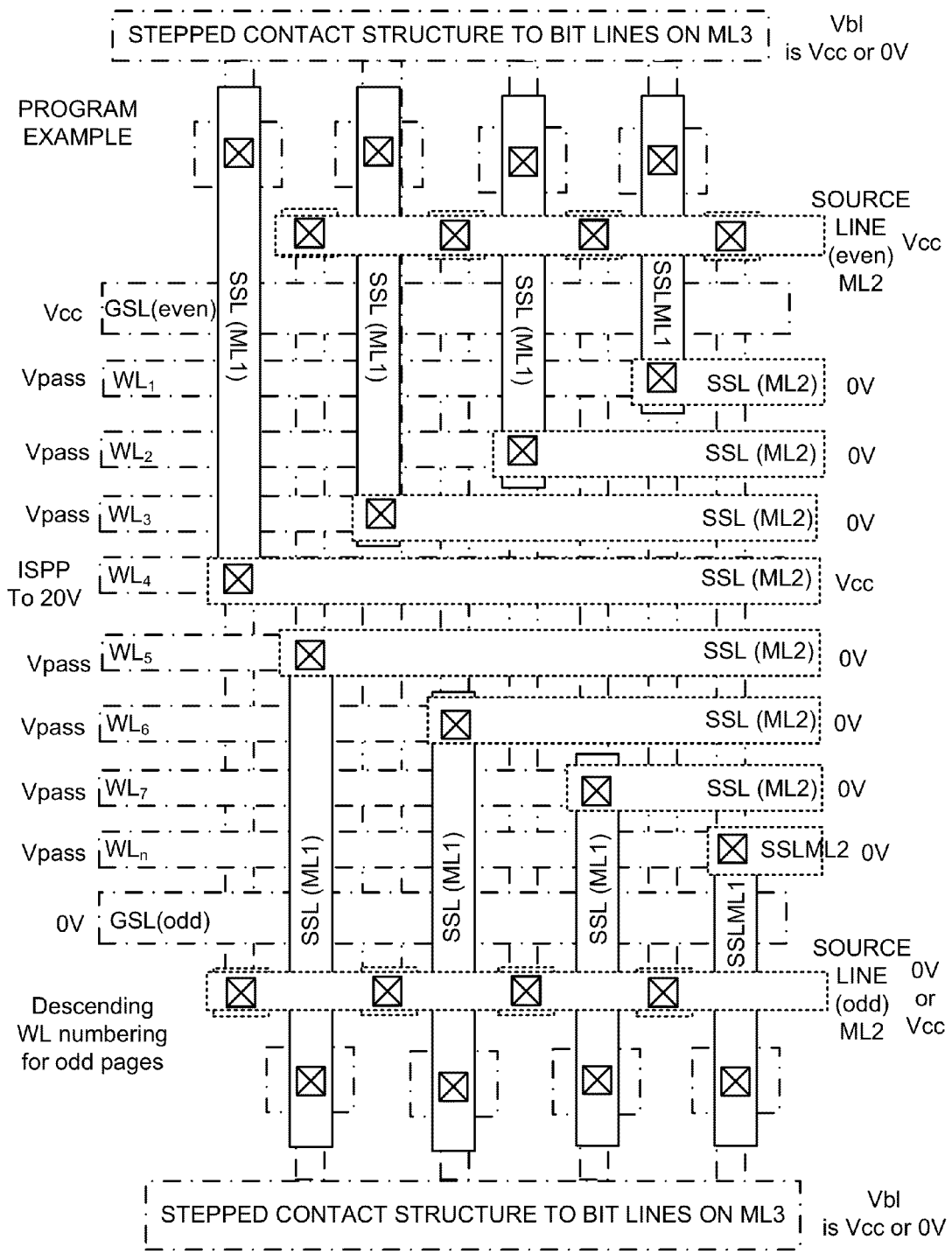

The layout view of FIG. 28 shows an example of a program bias arrangement. Particular bit lines, which in turn are electrically connected to different planes of semiconductor strips, are biased at either Vcc (inhibit) or 0V (program). The SSL of the selected stack of semiconductor strips is at Vcc, and all other SSL's are 0V. For this semiconductor strip in an "odd" stack being programmed, the GSL (even) is turned on at Vcc to allow the bit line bias to pass, and the GSL (odd) is turned off at 0V to disconnect the source line (odd). Source line (even) is at Vcc for self-boosting to avoid disturb of adjacent even pages. The word lines are at Vpass voltages, except for the selected word line which undergoes ISPP to 20V.

The shown memory unit is repeated above and below, sharing the same bit lines. These repeated units are also programmed at the same time, typically the same plane as the plane of the shown memory unit.

If instead a semiconductor strip in an "even" stack is being programmed, then the odd and even signals are switched.

Figure 29:
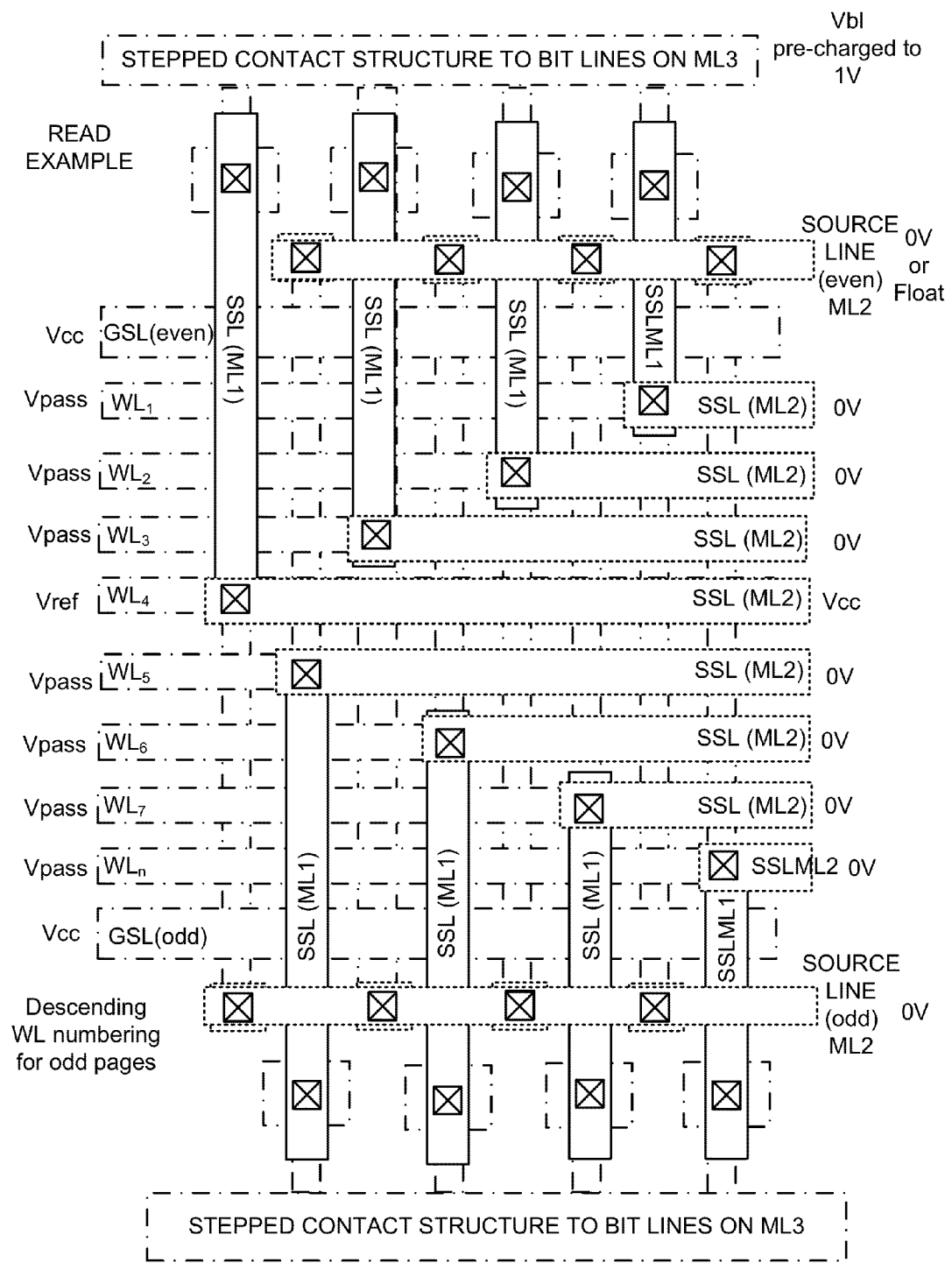

The layout view of FIG. 29 shows an example of a read bias arrangement. Particular bit lines, which in turn are electrically connected to different planes of semiconductor strips, are at a read bias, such as pre-charge to 1V. The SSL of the selected stack of semiconductor strips is at Vcc, and all other SSL's are 0V. For this semiconductor strip in an "odd" stack being read, both the GSL (even) is turned on at Vcc to allow the bit line bias to pass, and the GSL (odd) is turned on at Vcc to connect the source line (odd). Both source line (even) and source line (odd) are off at 0V. The word lines are at Vpass voltages, except for the selected word line which is at Vref.

The shown memory unit is repeated above and below, sharing the same bit lines. These repeated units are also read at the same time.

The layout view of FIG. 30 shows a first example of an erase bias arrangement. The source lines, even and odd, are at +13V. The bit lines, which in turn are electrically connected to different planes of semiconductor strips, are floated and boosted to 13V. The word lines are all at 0V. All the SSL, and both the even and odd GSL are at a medium voltage such as 6V to prevent disturb.

The shown memory unit is repeated above and below, sharing the same bit lines. Other unselected memory units have floating word lines to provide self-boosting erase inhibiting.

Figure 31:
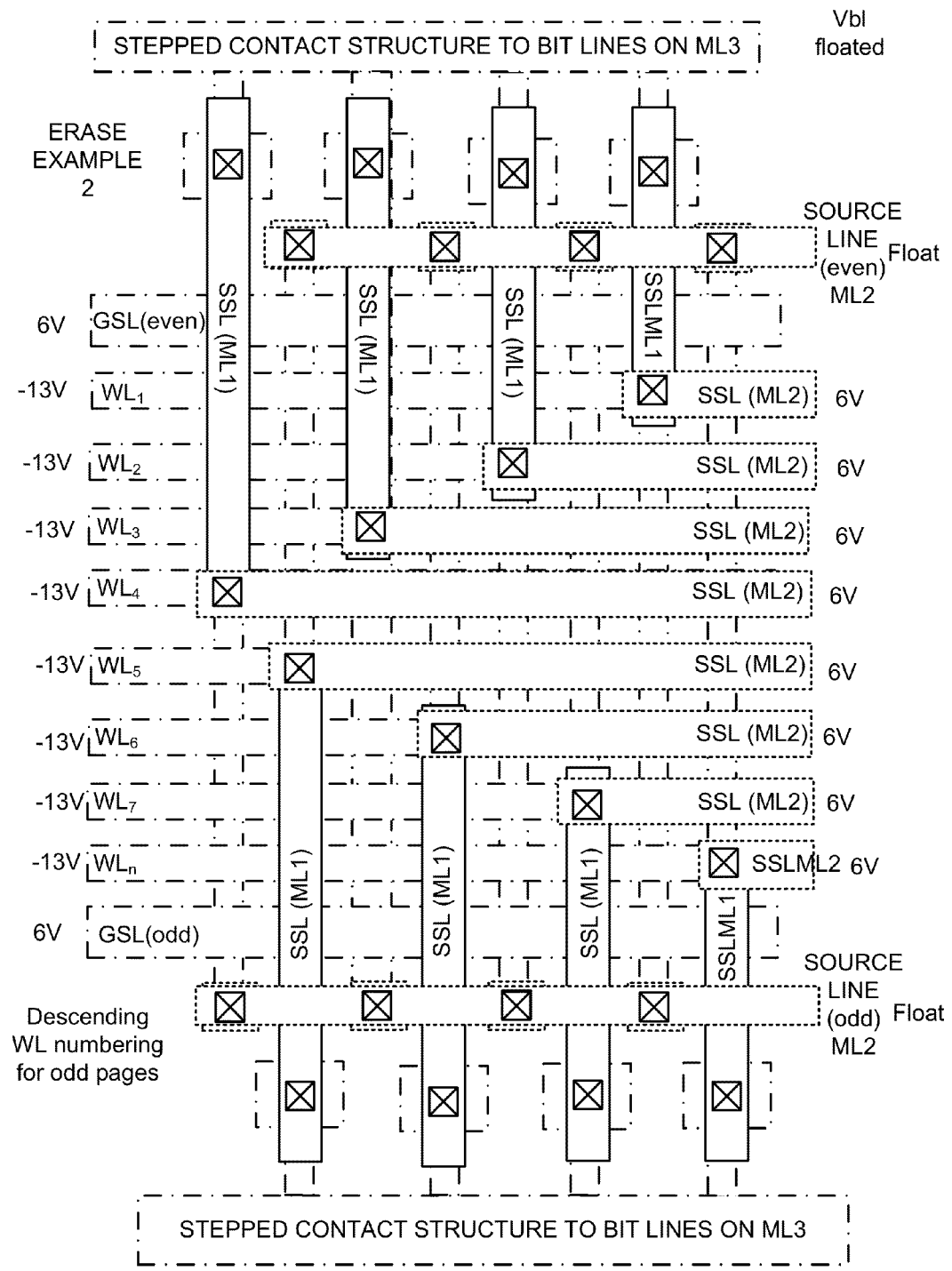
Figure 32:
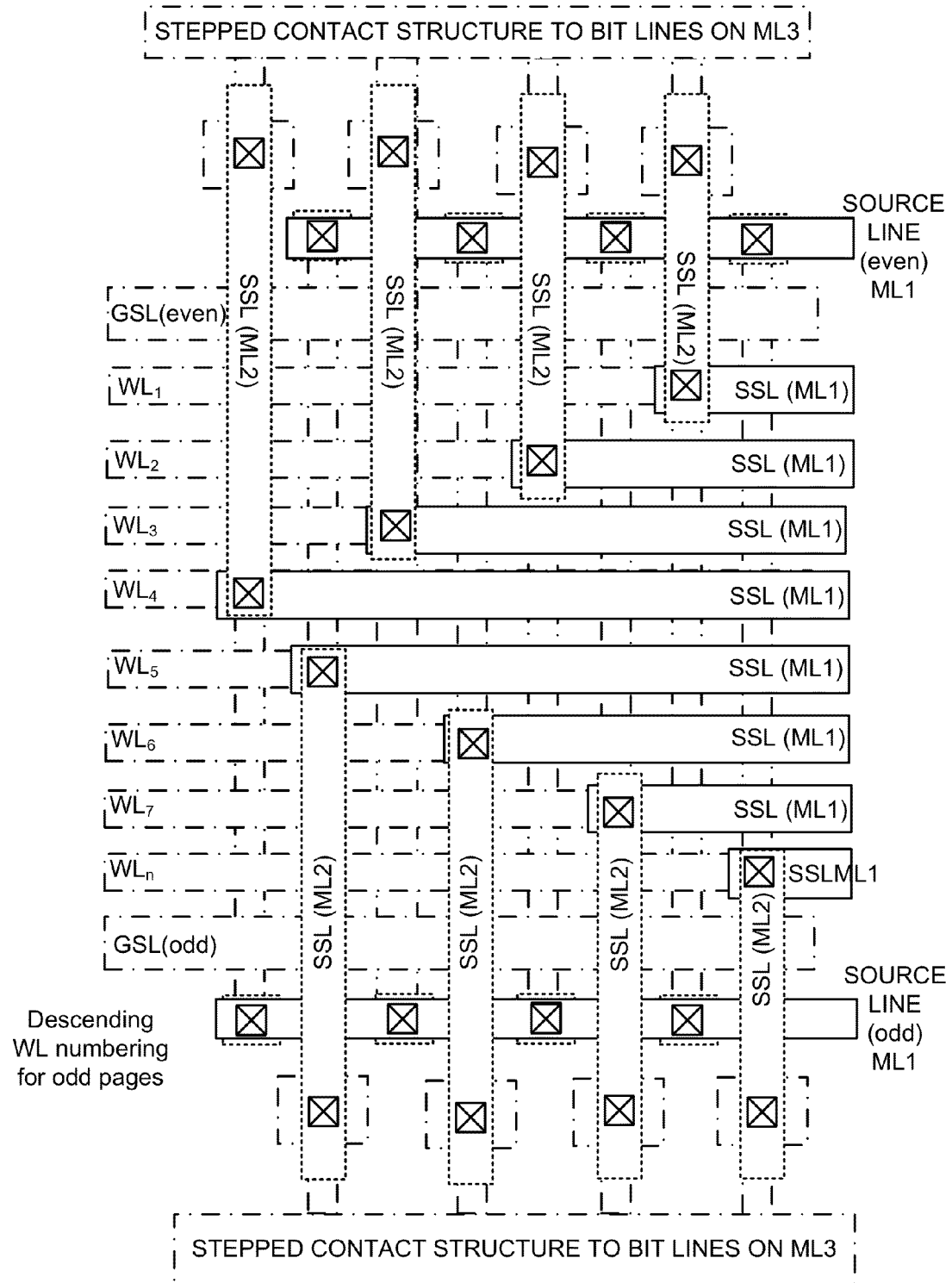
FIGS. 32-36 are layout views of the second 3D NAND-flash memory array structure of FIGS. 23-26, with various bias arrangements.

The layout view of FIG. 31 shows a second example of an erase bias arrangement. The word lines are all at −13V, and the source lines are floated.

FIGS. 32-36 are layout views of the second 3D NAND-flash memory array structure of FIGS. 23-26, with various bias arrangements. This second 3D NAND-flash memory array structure shown in FIGS. 32-36 is broadly similar to the layout views of the first 3D NAND-flash memory array structure shown in FIGS. 27-31. However, whereas the first 3D NAND-flash memory array shown by FIGS. 27-31 has string select lines which lead to the decoder at ML2, and the string select lines which lead to the SSL gate structures on ML1; the second 3D NAND-flash memory array shown by FIGS. 32-36 has string select lines which lead to the decoder at ML1, and the string select lines which lead to the SSL gate structures on ML2.

Figure 33:
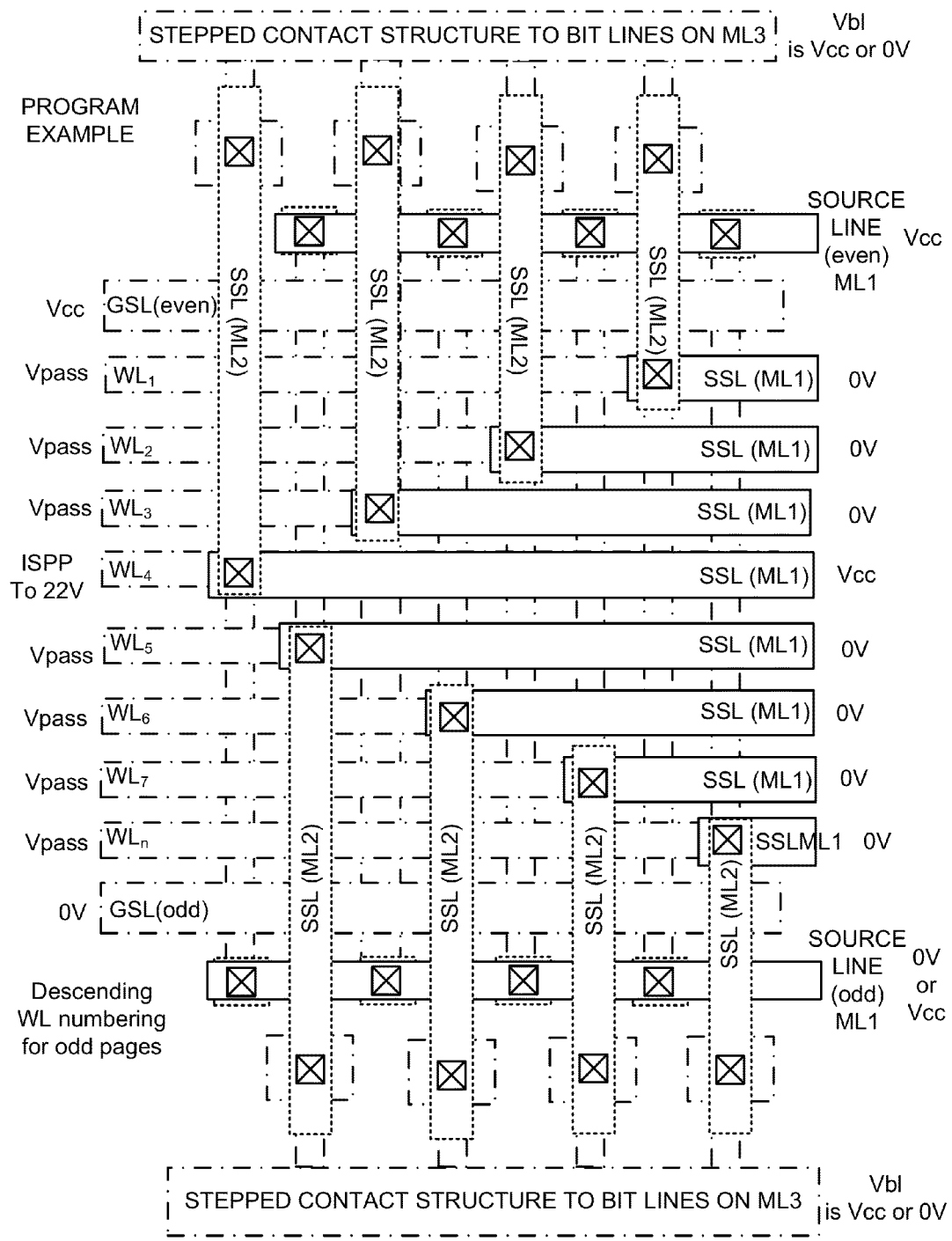

The layout view of FIG. 33 shows an example of a program bias arrangement. Particular bit lines, which in turn are electrically connected to different planes of semiconductor strips, are biased at either Vcc (inhibit) or 0V (program). The SSL of the selected stack of semiconductor strips is at Vcc, and all other SSL's are 0V. For this semiconductor strip in an "odd" stack being programmed, the GSL (even) is turned on at Vcc to allow the bit line bias to pass, and the GSL (odd) is turned off at 0V to disconnect the source line (odd). Source line (even) is at Vcc for self-boosting to avoid disturb of adjacent even pages. The word lines are at Vpass voltages, except for the selected word line which undergoes ISPP to 22V.

The shown memory unit is repeated above and below, sharing the same bit lines. These repeated units are also programmed at the same time, typically the same plane as the plane of the shown memory unit.

If instead a semiconductor strip in an "even" stack is being programmed, then the odd and even signals are switched.

Figure 34:
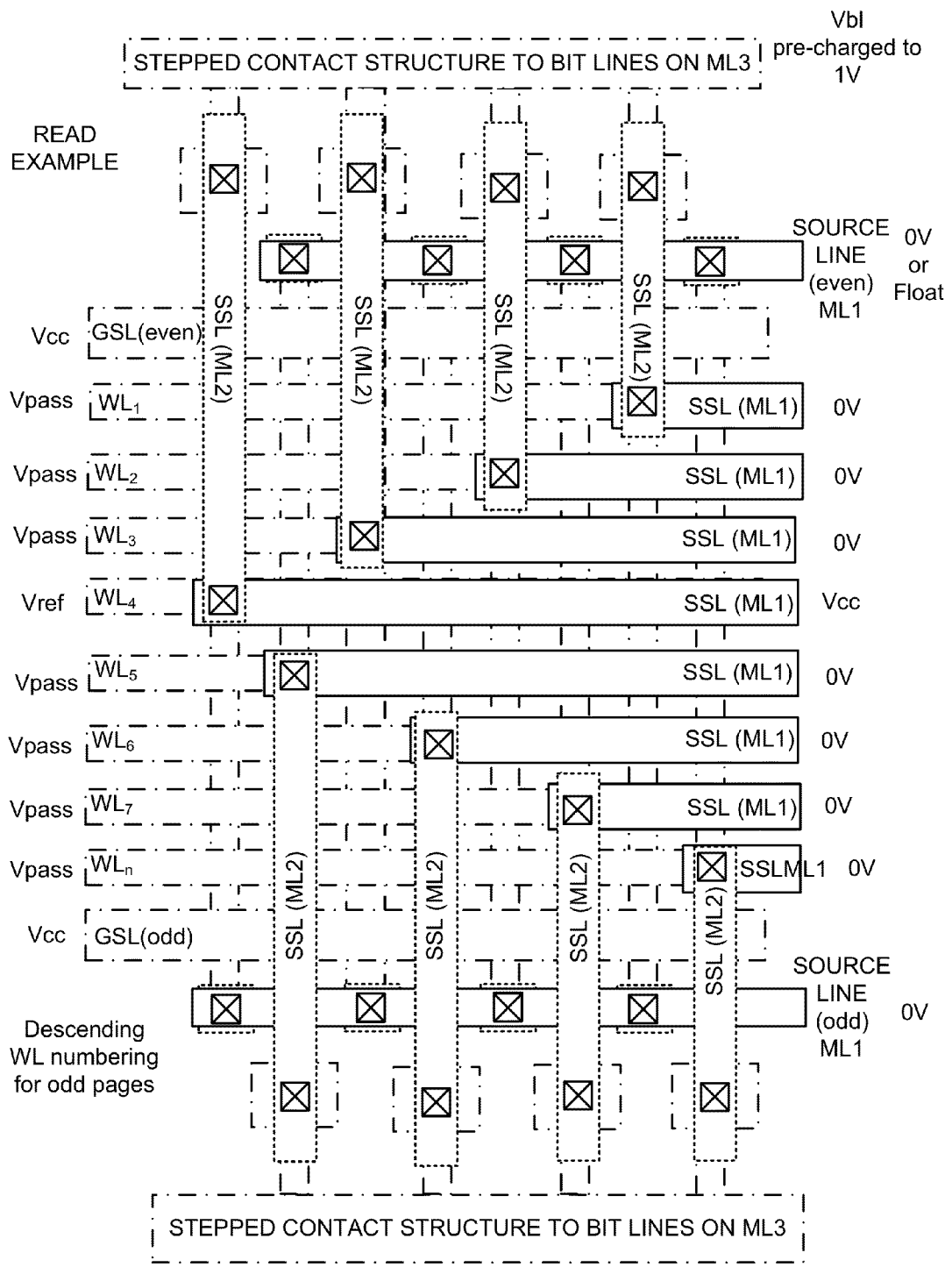

The layout view of FIG. 34 shows an example of a read bias arrangement. Particular bit lines, which in turn are electrically connected to different planes of semiconductor strips, are at a read bias, such as pre-charge to 1V. The SSL of the selected stack of semiconductor strips is at Vcc, and all other SSL's are 0V. For this semiconductor strip in an "odd" stack being read, both the GSL (even) is turned on at Vcc to allow the bit line bias to pass, and the GSL (odd) is turned on at Vcc to connect the source line (odd). Both source line (even) and source line (odd) are off at 0V. The word lines are at Vpass voltages, except for the selected word line which is at Vref.

The shown memory unit is repeated above and below, sharing the same bit lines. These repeated units are also read at the same time.

Figure 35:
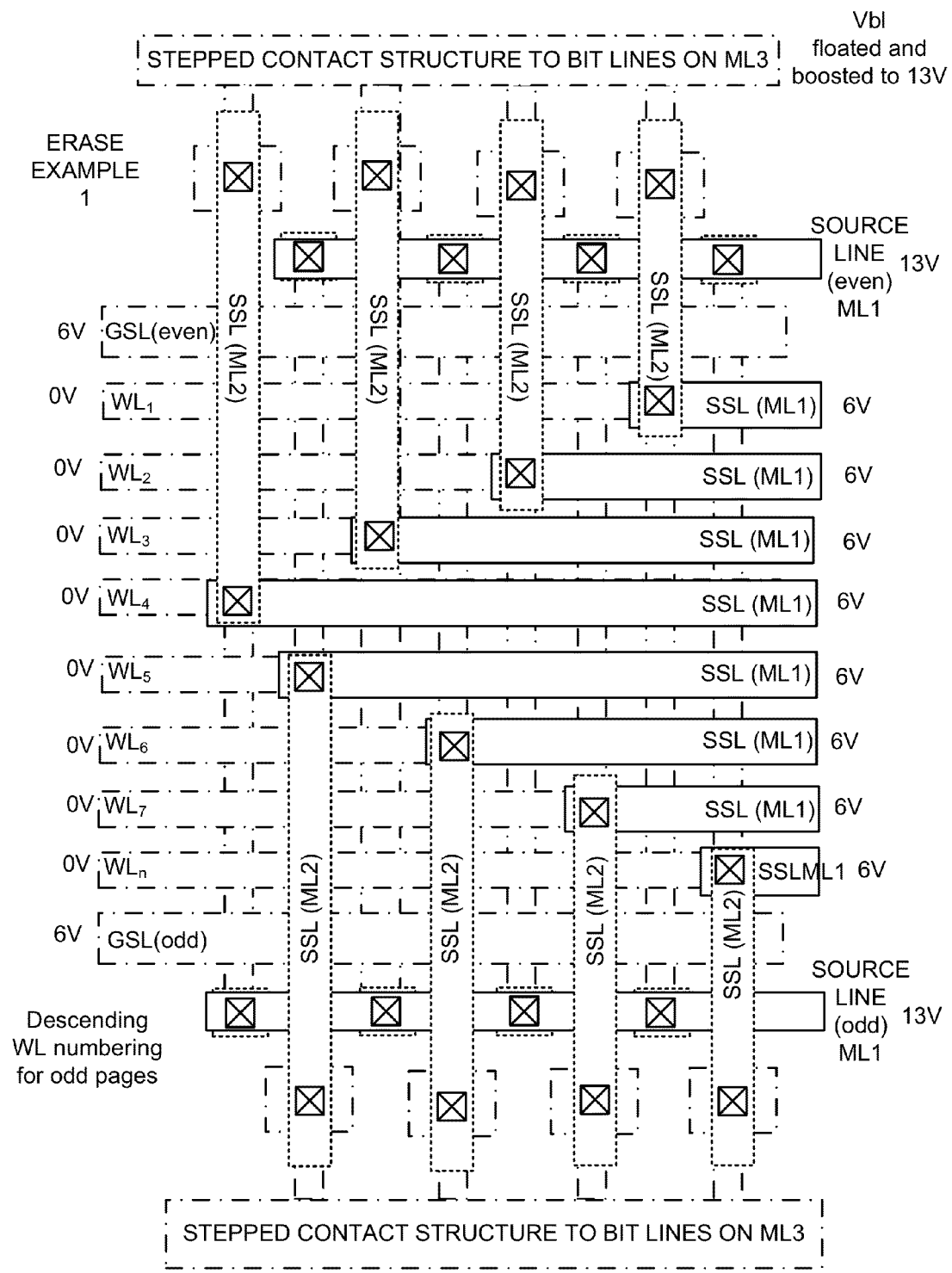

The layout view of FIG. 35 shows a first example of an erase bias arrangement. The source lines, even and odd, are at +13V. The bit lines, which in turn are electrically connected to different planes of semiconductor strips, are floated and boosted to 13V. The word lines are all at 0V. All the SSL, and both the even and odd GSL are at a medium voltage such as 6V to prevent disturb.

The shown memory unit is repeated above and below, sharing the same bit lines. Other unselected memory units have floating word lines to provide self-boosting erase inhibiting.

Figure 36:
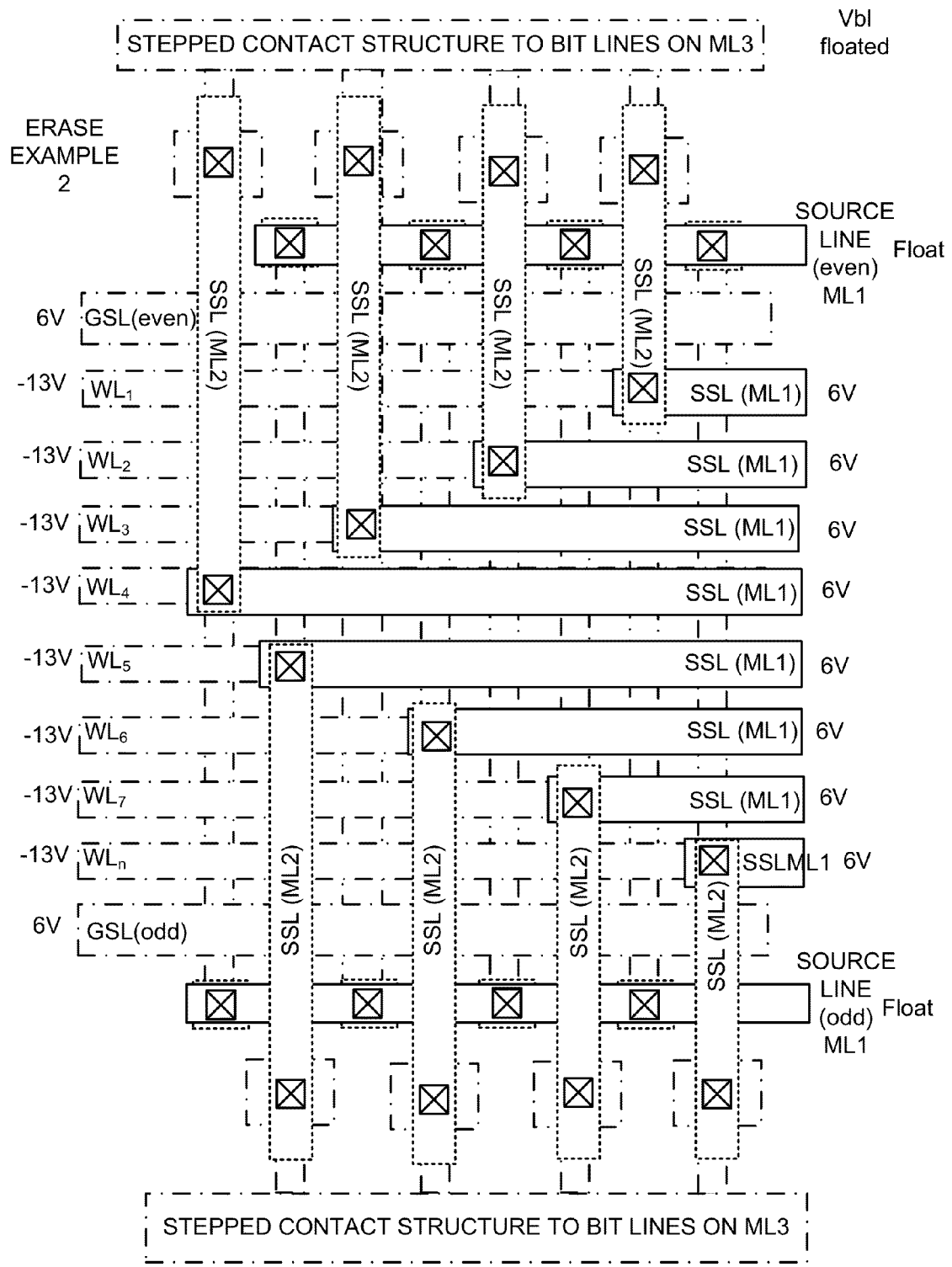

The layout view of FIG. 36 shows a second example of an erase bias arrangement. The word lines are all at −13V, and the source lines are floated.

Although not shown, anti-fuse bias arrangements are discussed briefly. To program a selected anti-fuse type cell, in this embodiment the selected word line can be biased with −7 Volts, the unselected word lines can be set at 0 Volts, the selected bit line can be set at 0 Volts, the unselected bit lines can be set at 0 Volts, the selected SSL line can be set at −3.3 volts, and the unselected SSL lines can be set at 0 Volts. To read a selected cell, in this embodiment the selected word line can be biased with −1.5 Volts, the unselected word lines can be set at 0 Volts, the selected bit line can be set at 0 Volts, the unselected bit lines can be set at 0 Volts, the selected SSL line can be set at −3.3 volts, and the unselected SSL lines can be set at 0 Volts.

Figure 37:
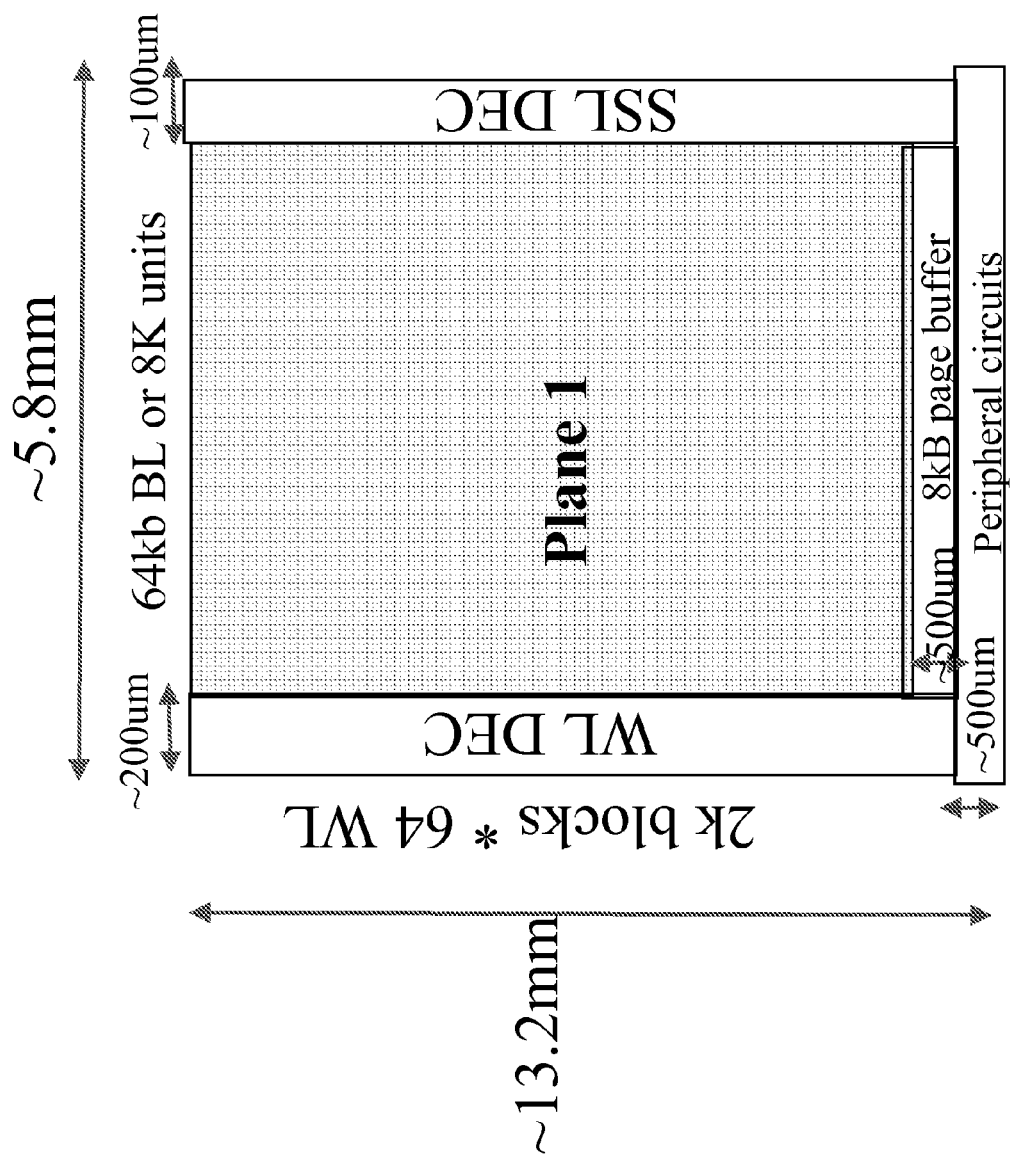
FIG. 37 is a plane view of a 3D memory array.

FIG. 37 is a plane view of a 3D memory array. In the shown array, Y half pitch=32 nm and X half pitch=43 nm. There are 4 memory layers in the 3D VG NAND. Core efficiency in the array is about 67% (66 WLs, with overhead of SSL gates, GSL, SL, and BL contacts). The density is 32 Gb with SLC (1b/c) operation. The die size is ~76 mm$^2$.

Figure 38:
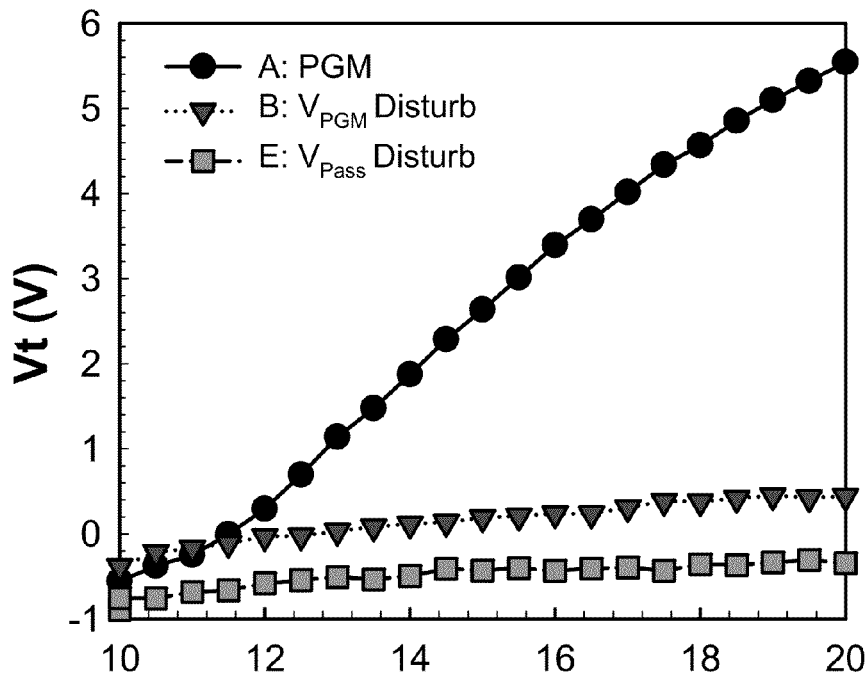
FIGS. 38-39 show graphs of different types of disturb, corresponding to the programming voltage and the number of programming operations.
Figure 39:
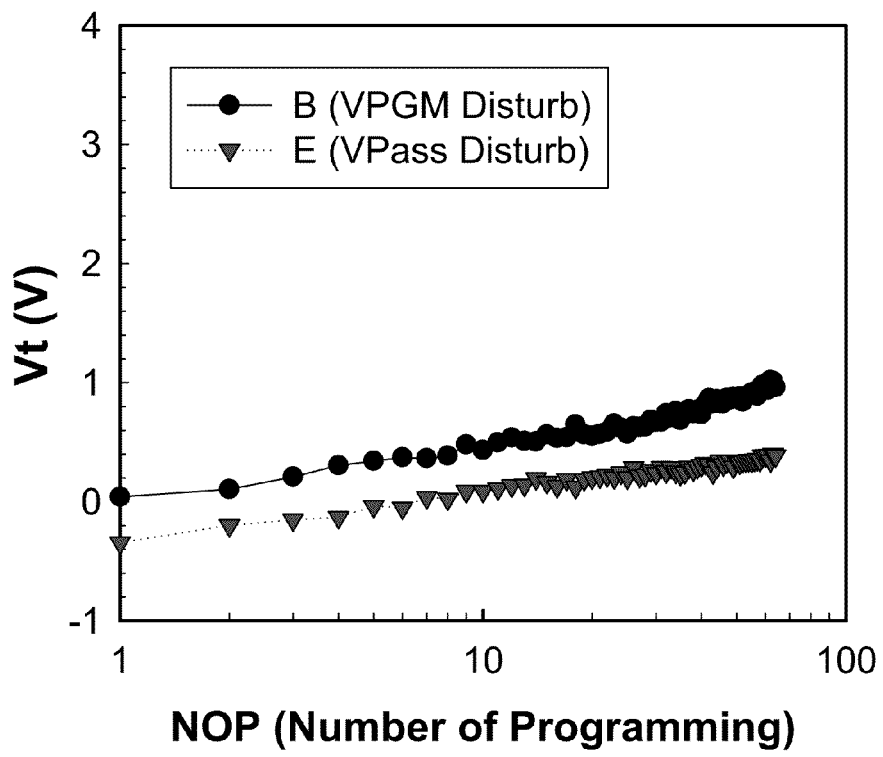

FIGS. 38-39 show graphs of different types of disturb, corresponding to the programming voltage and the number of programming operations.

FIG. 38 is a graph of different types of disturb, resulting from increasing program voltage during ISPP programming. This can be understood with reference to FIG. 8. FIG. 8 shows that program disturb affects memory cell B which receives the same word line voltage as the selected memory cell A, but is positioned in a neighboring semiconductor strip. FIG. 8 shows that pass disturb affects memory cell E which receives a different word line voltage as the adjacent selected memory cell A, but is positioned in the same semiconductor strip.

FIG. 39 is a graph of different types of disturb, resulting from repeating programming operations (number of programming, NOP). With stress of NOP=64, the disturb magnitude is around 0.5V~1V larger of a Vt shift, compared to NOP=1. Fortunately, the magnitude of NOP induced Vt shift is a function of the log of NOP.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an integrated circuit substrate;
a plurality of stacks of semiconductor material strips extending out of the integrated circuit substrate, the plurality of stacks being ridge-shaped and including at least two semiconductor material strips separated by insulating material into different plane positions of a plurality of plane positions;
a plurality of word lines arranged orthogonally over, and having surfaces conformal with, the plurality of stacks, such that a 3D array of interface regions is established at cross-points between surfaces of the plurality of stacks and the plurality of word lines;
memory elements in the interface regions, which establish a 3D array of memory cells accessible via the plurality of semiconductor material strips and the plurality of word lines, the memory cells arranged in strings between bit line structures and source line structures; and
a plurality of string select gate structures, different ones of the plurality of string select gate structures coupling different ones of the stacks of semiconductor material strips to different ones of a plurality of string select lines, the plurality of string select gate structures coupled to alternating ends of the stacks of semiconductor material strips, such that string select gate structures of the plurality of string select gate structures are coupled to every other one of a first end of the stacks of semiconductor material strips and to every other one of a second end of the stacks of semiconductor material strips.

2. The device of claim 1, wherein a combined selection of a particular bit line of a plurality of bit lines, a particular string select line of the plurality of string select lines, and a particular word line of the plurality of word lines, identifies a particular memory cell of the 3D array of memory cells.

3. The device of claim 1, wherein the string select gate structures include conductive conformal structures that establish string select devices at cross-points between surfaces of the plurality of stacks and the conductive conformal structures.

4. The device of claim 1, including
a first ground select line arranged orthogonally over, and having surfaces conformal with, the plurality of stacks;
a second ground select line arranged orthogonally over, and having surfaces conformal with, the plurality of stacks,
wherein the first ground select line and the second ground select line are on opposite ends of the plurality of stacks, and
wherein ground select devices are established at cross-points between surfaces of the plurality of stacks and the first ground select line and at cross-points between surfaces of the plurality of stacks and the second ground select line.

5. The device of claim 1, including:
a first bit line structure at a first end of the stacks and coupled to the bit line ends of the strings having the bit line end-to-source line end orientation;
a second bit line structure at a second end of the stacks and coupled to the bit line ends of the strings having the source line end-to-bit line end orientation.

6. The device of claim 1, including:
a first bit line structure at a first end of the stacks and coupled to the bit line ends of the strings having the bit line end-to-source line end orientation;
a second bit line structure at a second end of the stacks and coupled to the bit line ends of the strings having the source line end-to-bit line end orientation,
wherein the source line ends of the strings having the bit line end-to-source line end orientation terminate before reaching the second bit line structure, and
wherein the source line ends of the strings having the source line end-to-bit line end orientation terminate before reaching the first bit line structure.

7. The device of claim 1, including:
a first bit line structure at a first end of the stacks and coupled to the bit line ends of the strings having the bit line end-to-source line end orientation;
a second bit line structure at a second end of the stacks and coupled to the bit line ends of the strings having the source line end-to-bit line end orientation, and
gaps adjacent to the string select gate structures, the gaps between the source line ends of the strings having the bit line end-to-source line end orientation and the second bit line structure, and between the source line ends of the strings having the source line end-to-bit line end orientation and the first bit line structure.

8. The device of claim 1, including:
a first plurality of string select lines arranged over the plurality of stacks, and parallel to the semiconductor material strips, string select lines of the first plurality of string select lines electrically coupled to different string select gate structures of the plurality of string select gate structures; and
a second plurality of string select lines arranged over, and parallel to, the plurality of word lines, the second plurality of string select lines coupling the first plurality of string select lines and a string select line decoder,
wherein the first plurality of string select lines is at a layer higher than the second plurality of string select lines.

9. The device of claim 1, including:
a first plurality of string select lines arranged over the plurality of stacks, and parallel to the semiconductor material strips, string select lines of the first plurality of string select lines electrically coupled to different string select gate structures of the plurality of string select gate structures; and
a second plurality of string select lines arranged over, and parallel to, the plurality of word lines, the second plurality of string select lines coupling the first plurality of string select lines and a string select line decoder,
wherein the first plurality of string select lines is at a layer lower than the second plurality of string select lines.

10. The device of claim 1, wherein the memory elements include charge trapping structures comprising a tunneling layer, a charge trapping layer and a blocking layer.

11. A memory device, comprising:
an integrated circuit substrate;
a plurality of stacks of semiconductor material strips extending out of the integrated circuit substrate, the plurality of stacks being ridge-shaped and including at least two semiconductor material strips separated by insulating material into different plane positions of a plurality of plane positions;
a plurality of word lines arranged orthogonally over, and having surfaces conformal with, the plurality of stacks, such that a 3D array of interface regions is established at cross-points between surfaces of the plurality of stacks and the plurality of word lines;
memory elements in the interface regions, which establish a 3D array of memory cells accessible via the plurality of semiconductor material strips and the plurality of word lines, the memory cells arranged in strings between bit line structures and source line structures,
wherein a first string and a second string of the strings are adjacent and have opposite orientations, such that the first string has a bit line end-to-source line end orientation and the second string has a source line end-to-bit line end orientation, such that the bit line end of the first string is proximate to the source line end of the second string, and the bit line end of the second string is proximate to the source line end of the first string.

12. The device of claim 11, wherein a combined selection of a particular bit line of a plurality of bit lines, a particular string select line of a plurality of string select lines coupled to opposite orientations of the strings, and a particular word line of the plurality of word lines, identifies a particular memory cell of the 3D array of memory cells.

13. The device of claim 11, including
a first ground select line arranged orthogonally over, and having surfaces conformal with, the plurality of stacks;
a second ground select line arranged orthogonally over, and having surfaces conformal with, the plurality of stacks,
wherein the first ground select line and the second ground select line are on opposite ends of the plurality of stacks, and
wherein ground select devices are established at cross-points between surfaces of the plurality of stacks and the first ground select line and at cross-points between surfaces of the plurality of stacks and the second ground select line.

14. The device of claim 11, including:
a first bit line structure at a first end of the stacks and coupled to the bit line ends of the strings having the bit line end-to-source line end orientation;
a second bit line structure at a second end of the stacks and coupled to the bit line ends of the strings having the source line end-to-bit line end orientation.

15. The device of claim 11, including:
a first bit line structure at a first end of the stacks and coupled to the bit line ends of the strings having the bit line end-to-source line end orientation;
a second bit line structure at a second end of the stacks and coupled to the bit line ends of the strings having the source line end-to-bit line end orientation,
wherein the source line ends of the strings having the bit line end-to-source line end orientation terminate before reaching the second bit line structure, and
wherein the source line ends of the strings having the source line end-to-bit line end orientation terminate before reaching the first bit line structure.

16. The device of claim 11, including:
a first plurality of string select lines arranged over the plurality of stacks, and parallel to the semiconductor material strips, string select lines of the first plurality of string select lines electrically coupled to different stacks of the plurality of stacks; and
a second plurality of string select lines arranged over, and parallel to, the plurality of word lines, the second plurality of string select lines coupling the first plurality of string select lines and a string select line decoder,
wherein the first plurality of string select lines is at a layer higher than the second plurality of string select lines.

17. The device of claim 11, including:
a first plurality of string select lines arranged over the plurality of stacks, and parallel to the semiconductor material strips, string select lines of the first plurality of string select lines electrically coupled to different stacks of the plurality of stacks; and
a second plurality of string select lines arranged over, and parallel to, the plurality of word lines, the second plurality of string select lines coupling the first plurality of string select lines and a string select line decoder,
wherein the first plurality of string select lines is at a layer lower than the second plurality of string select lines.

18. The device of claim 11, wherein the memory elements include charge trapping structures comprising a tunneling layer, a charge trapping layer and a blocking layer.

19. A memory device, comprising:
an integrated circuit substrate;
a 3D array of memory cells on the integrated circuit substrate, the 3D array including stacks of NAND strings of memory cells,
a plurality of string select gate structures, different ones of the plurality of string select gate structures coupling different ones of the stacks of NAND strings to different ones of a plurality of string select lines, the plurality of string select gate structures coupled to alternating ends of the stacks of NAND strings, such that string select gate structures of the plurality of string select gate structures are coupled to every other one of a first end of the plurality of stacks and to every other one of a second end of the plurality of stacks.

20. The device of claim 19, wherein a combined selection of a particular bit line of a plurality of bit lines, a particular string select line of the plurality of string select lines, and a particular word line of the plurality of word lines, identifies a particular memory cell of the 3D array of memory cells.

21. The device of claim 19, including
ground select devices at both the source line ends and the bit line ends of the NAND strings.

22. The device of claim 19, wherein the memory cells comprise memory elements that include charge trapping structures comprising a tunneling layer, a charge trapping layer and a blocking layer.

23. A memory device, comprising:
an integrated circuit substrate;
a 3D array of memory cells on the integrated circuit substrate, the 3D array including stacks of NAND strings of memory cells,
wherein a first stack and a second stack of the plurality of stacks are adjacent and have opposite orientations, such that the NAND strings of the first stack have a bit line end-to-source line end orientation and the NAND strings of the second stack have a source line end-to-bit line end orientation, such that the bit line ends of the NAND strings of the first stack are proximate to the source line ends of the NAND strings of the second stack, and the bit line ends of the NAND strings of the second stack are proximate to the source line ends of the NAND strings of the first stack.

24. The device of claim 23, wherein a combined selection of a particular bit line of a plurality of bit lines, a particular string select line of a plurality of string select lines opposite orientations of the strings, and a particular word line of a plurality of word lines, identifies a particular memory cell of the 3D array of memory cells.

25. The device of claim 23, including
ground select devices at both the source line ends and the bit line ends of the NAND strings.

26. The device of claim 23, wherein the memory cells comprise memory elements that include charge trapping structures comprising a tunneling layer, a charge trapping layer and a blocking layer.

* * * * *